US009461050B2

United States Patent
Kim et al.

(10) Patent No.: US 9,461,050 B2
(45) Date of Patent: Oct. 4, 2016

(54) SELF-ALIGNED LATERALLY EXTENDED STRAP FOR A DYNAMIC RANDOM ACCESS MEMORY CELL

(71) Applicant: GLOBALFOUNDRIES INC., Grand Cayman (KY)

(72) Inventors: Byeong Y. Kim, Lagrangeville, NY (US); Dan M. Mocuta, Lagrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 126 days.

(21) Appl. No.: 14/098,639

(22) Filed: Dec. 6, 2013

(65) Prior Publication Data
US 2015/0162336 A1    Jun. 11, 2015

(51) Int. Cl.
| H01L 27/108 | (2006.01) |
| H01L 29/78  | (2006.01) |
| H01L 29/66  | (2006.01) |
| H01L 21/308 | (2006.01) |

(52) U.S. Cl.
CPC ..... *H01L 27/10832* (2013.01); *H01L 21/3086* (2013.01); *H01L 27/1087* (2013.01); *H01L 27/10826* (2013.01); *H01L 27/10858* (2013.01); *H01L 27/10867* (2013.01); *H01L 27/10879* (2013.01); *H01L 29/6656* (2013.01); *H01L 29/785* (2013.01)

(58) Field of Classification Search
CPC ............. H01L 29/785; H01L 29/7853; H01L 29/7854; H01L 27/10826; H01L 27/10867; H01L 27/10829
See application file for complete search history.

(56) References Cited

U.S. PATENT DOCUMENTS

| 5,360,758 | A | 11/1994 | Bronner et al. |
| 5,923,971 | A | 7/1999 | Ho et al. |
| 6,495,876 | B1 | 12/2002 | Bronner et al. |
| 6,566,227 | B2 | 5/2003 | Wensley et al. |
| 6,667,504 | B1 | 12/2003 | Beintner et al. |
| 6,815,749 | B1 | 11/2004 | Mandelman et al. |
| 6,927,123 | B2 | 8/2005 | Huang et al. |
| 8,318,574 | B2 | 11/2012 | Doris et al. |
| 8,426,268 | B2 | 4/2013 | Cheng et al. |
| 2004/0000683 | A1 | 1/2004 | JaiPrakash et al. |
| 2004/0175897 | A1 | 9/2004 | Wensley et al. |
| 2005/0121703 | A1* | 6/2005 | Hieda ............... H01L 29/78648 257/288 |
| 2005/0124111 | A1 | 6/2005 | Huang et al. |

OTHER PUBLICATIONS

Kim, B. et al., "Nitride framed shallow trench isolation (NFSTI) for self-aligned buried strap in high performance trench capacitor DRAM/eDRAM" 2001 International Symposium on VLSI Technology, Systems, and Applications Proceedings of Technical Papers (Apr. 18-20, 2001) pp. 89-92.

* cited by examiner

*Primary Examiner* — Matthew Landau
*Assistant Examiner* — Scott Stowe
(74) *Attorney, Agent, or Firm* — Scully, Scott, Murphy & Presser, P.C.

(57) ABSTRACT

A self-aligned strap structure can be formed by forming trench capacitors and overlying trench top conductive material portions. End portions of fin mask structures overlie portions of the trench top conductive material portions. A dielectric spacer is formed around each end portions of the fin mask structure to cover additional areas of the trench top conductive material portions. An anisotropic etch is performed to recess portions of the trench top conductive material portions that are not covered by the fin mask structures or dielectric spacers. Conductive strap structures that are self-aligned to end portions of semiconductor fins are formed simultaneously with formation of the semiconductor fins. Access fin field effect transistors can be subsequently formed.

19 Claims, 25 Drawing Sheets

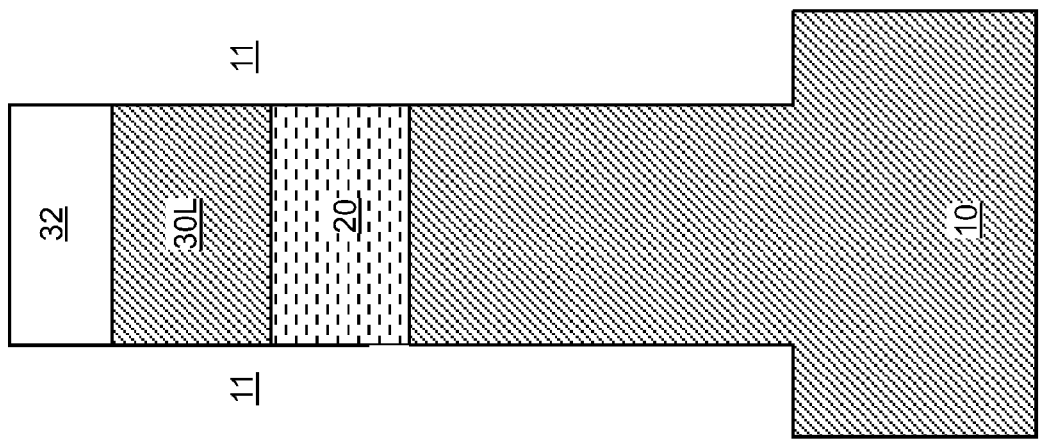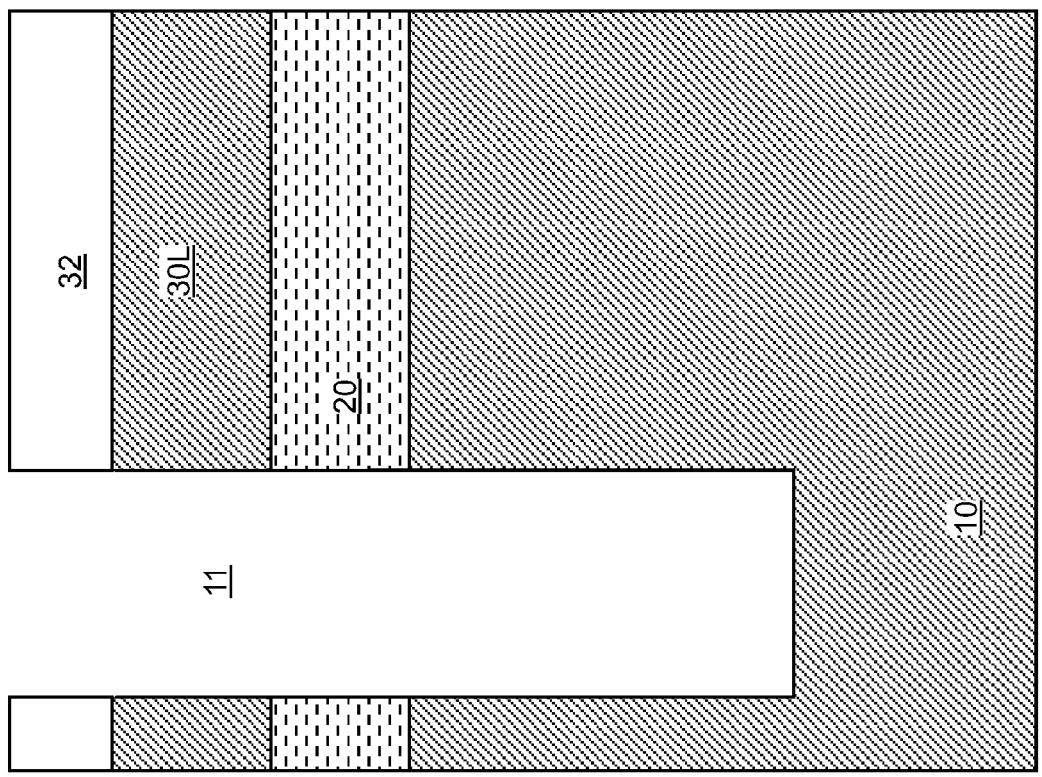

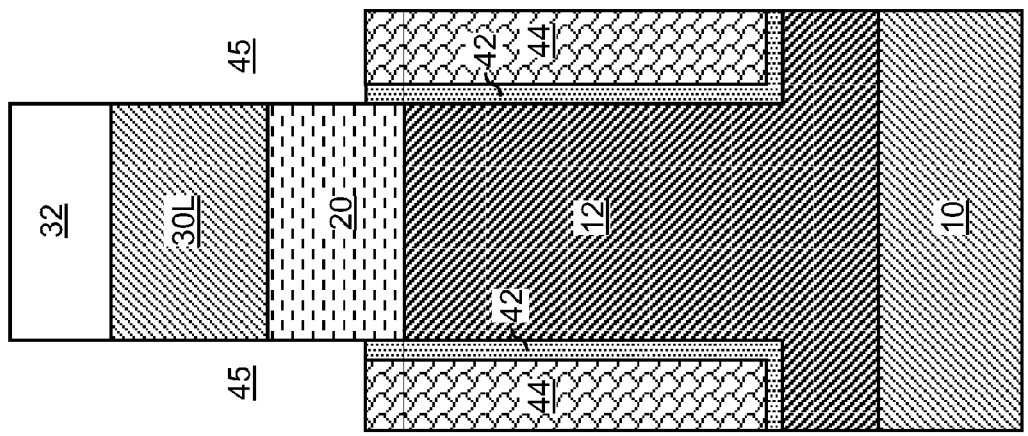
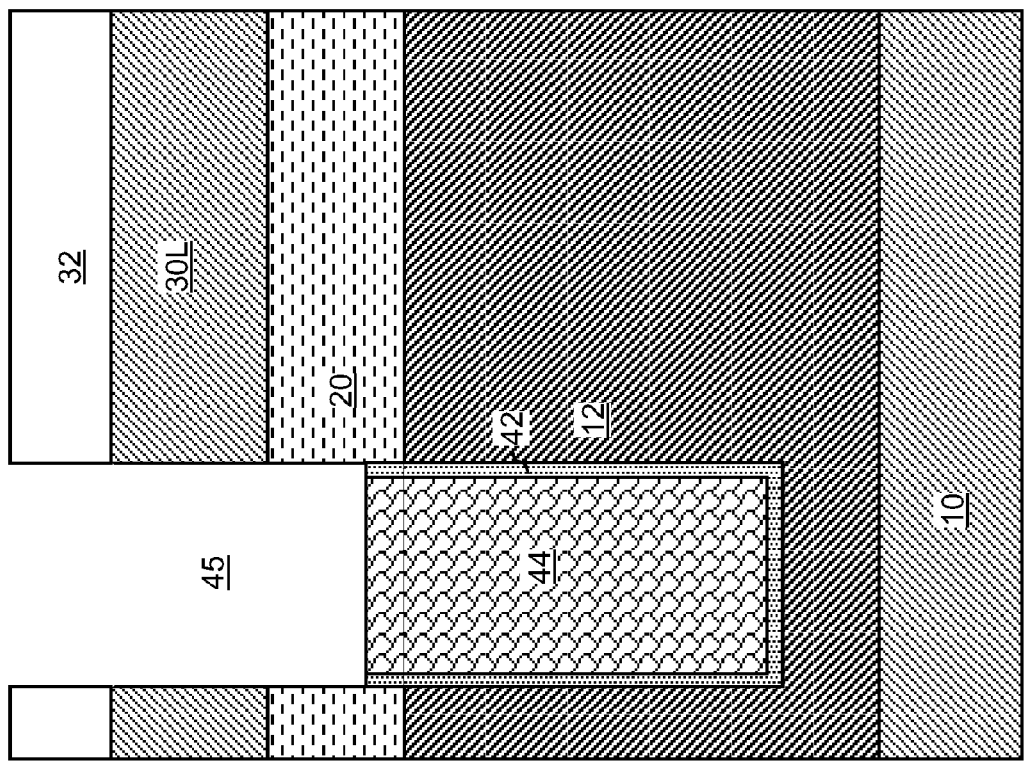
FIG. 2C
FIG. 2B

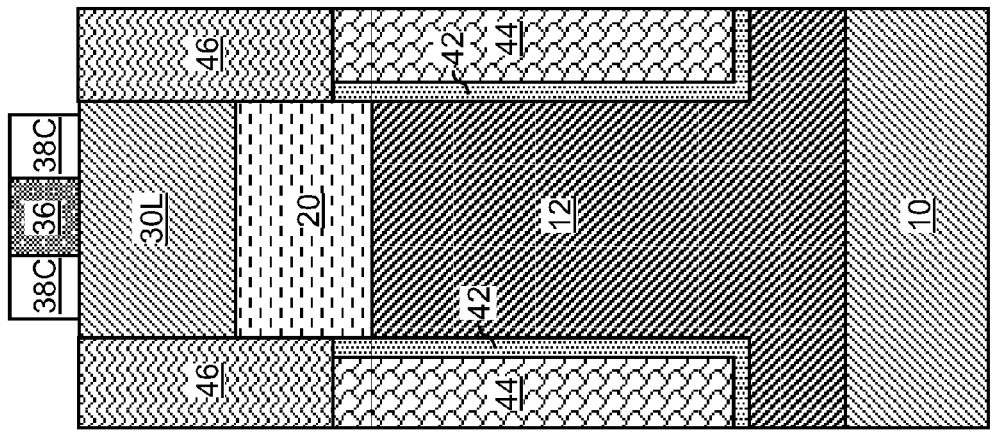
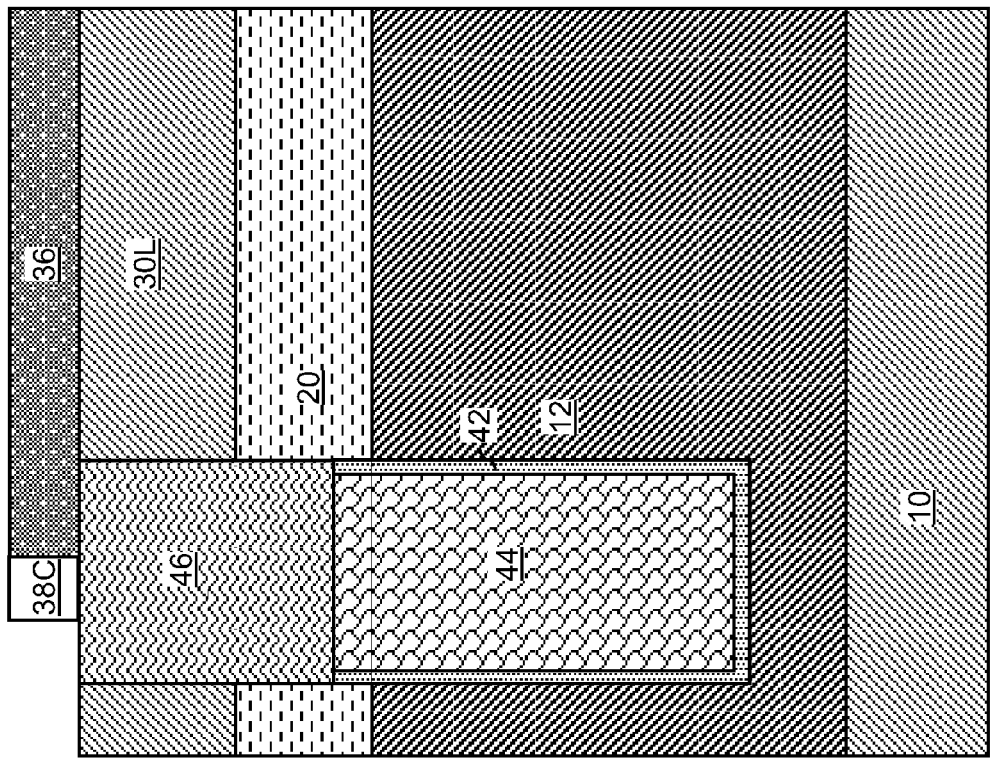

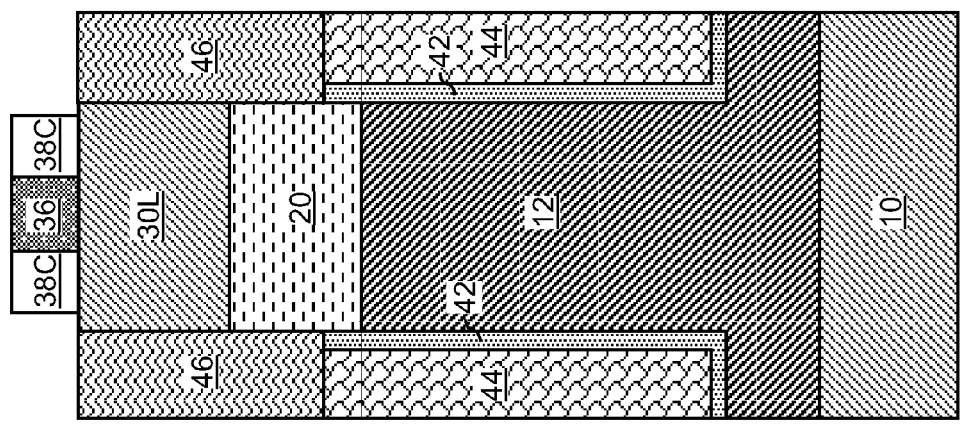
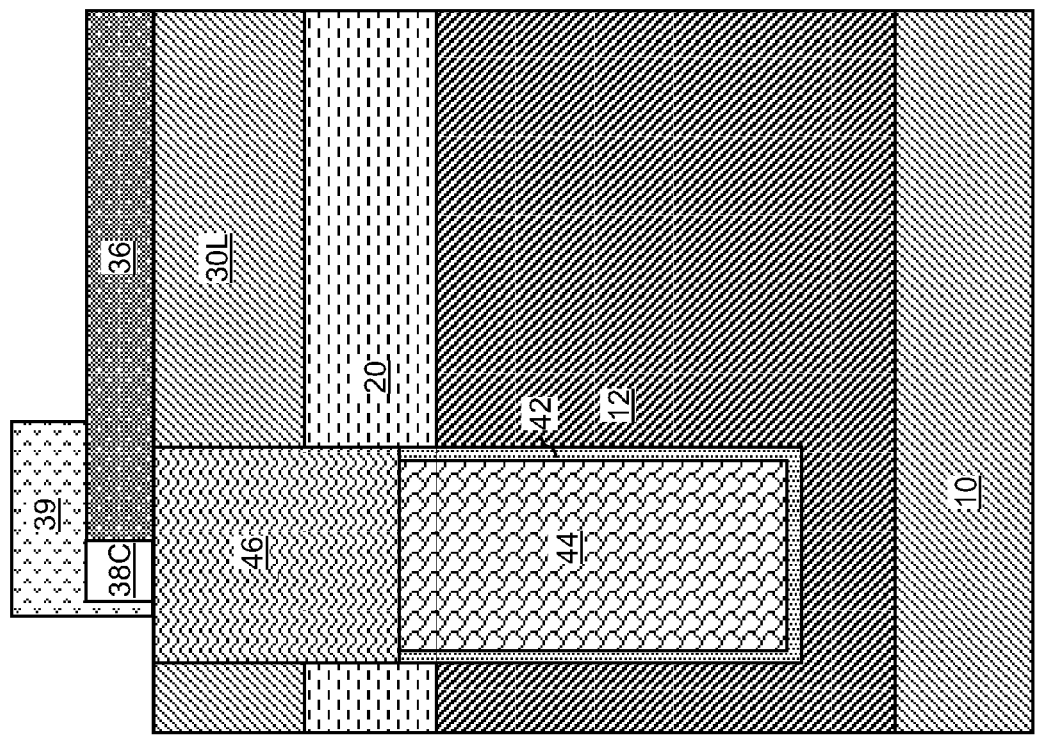

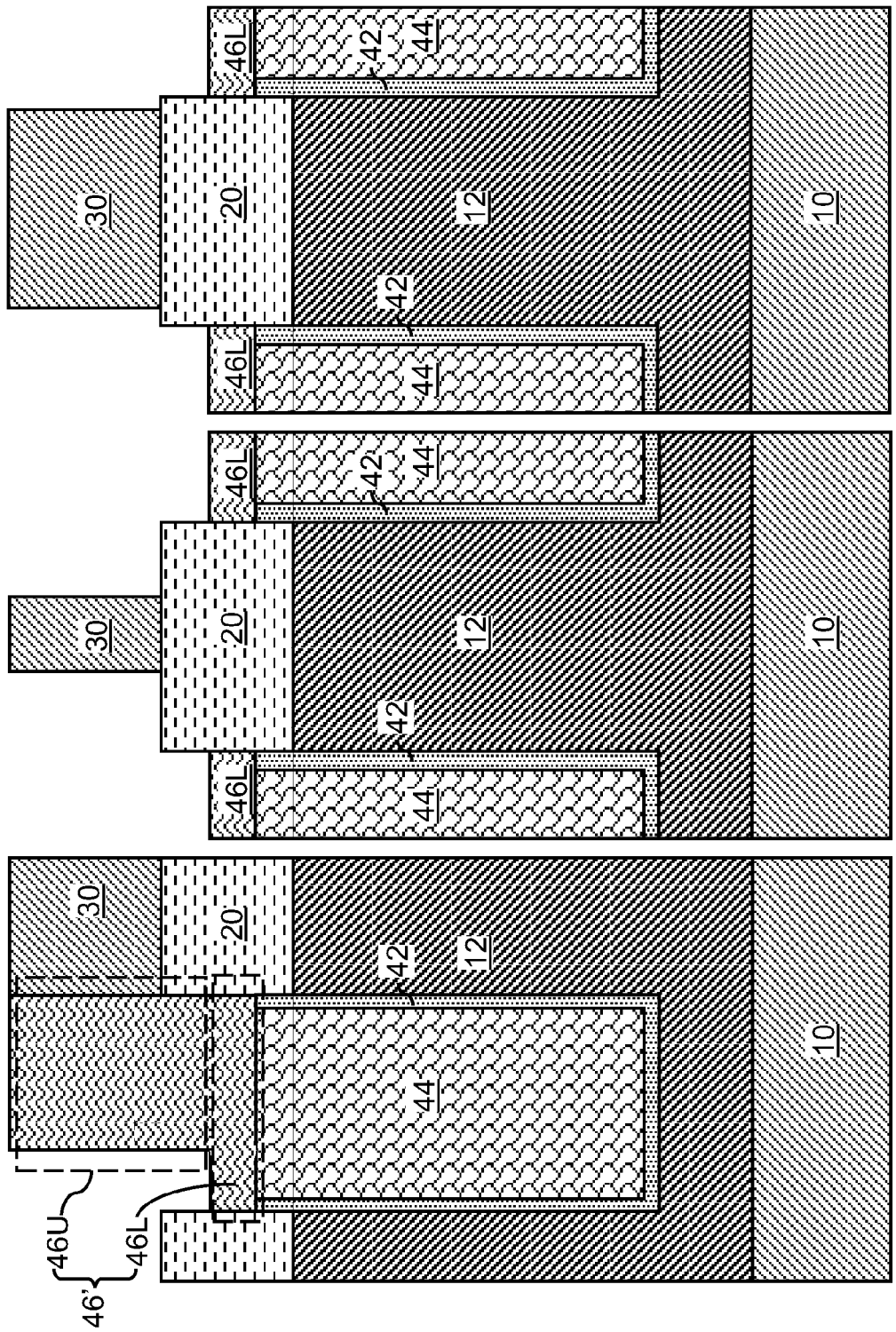

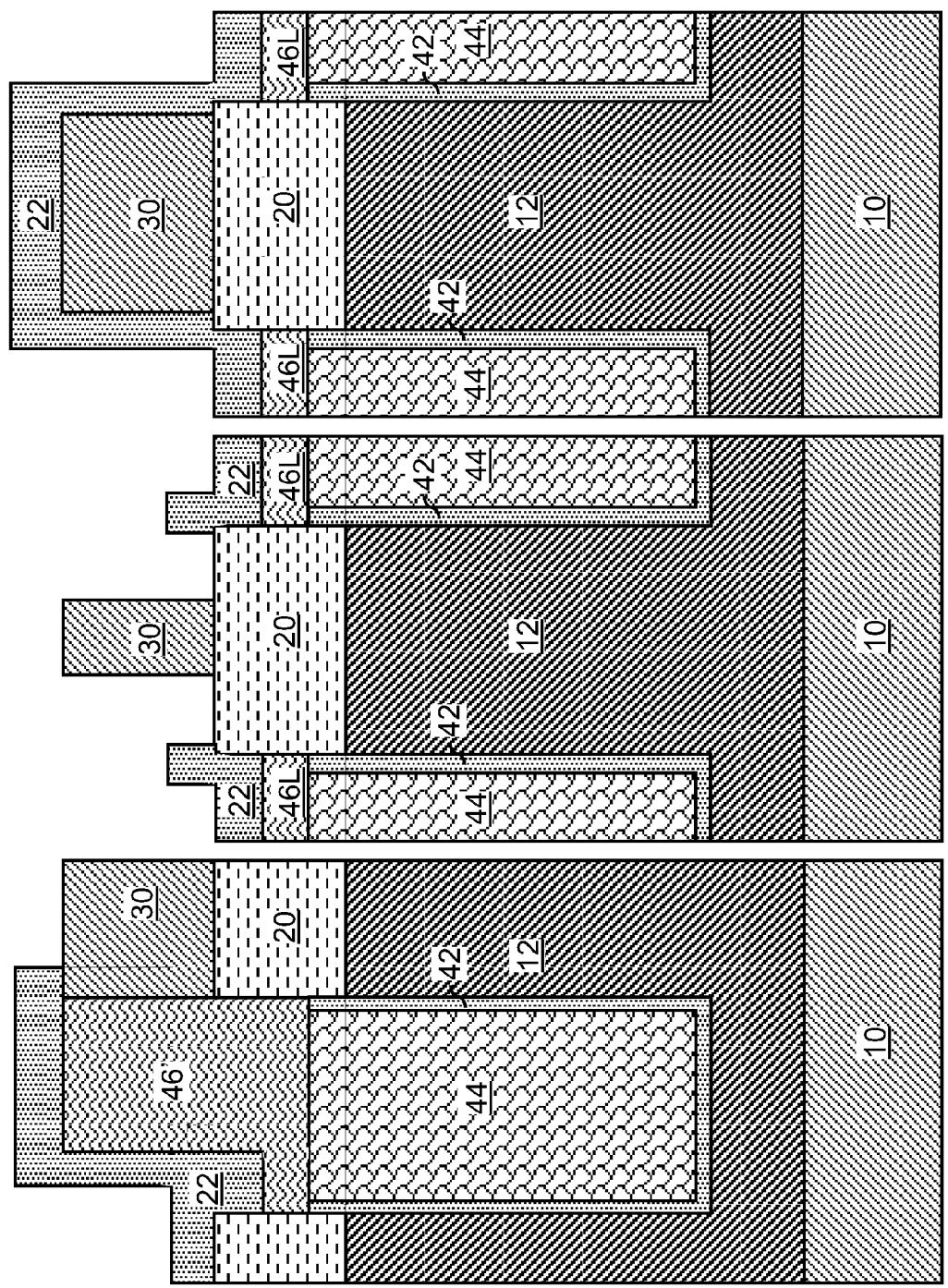

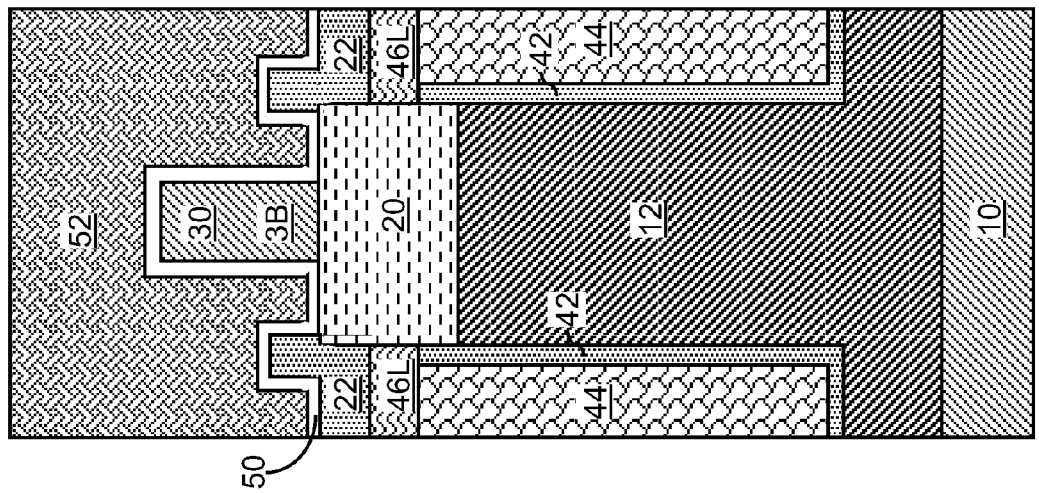
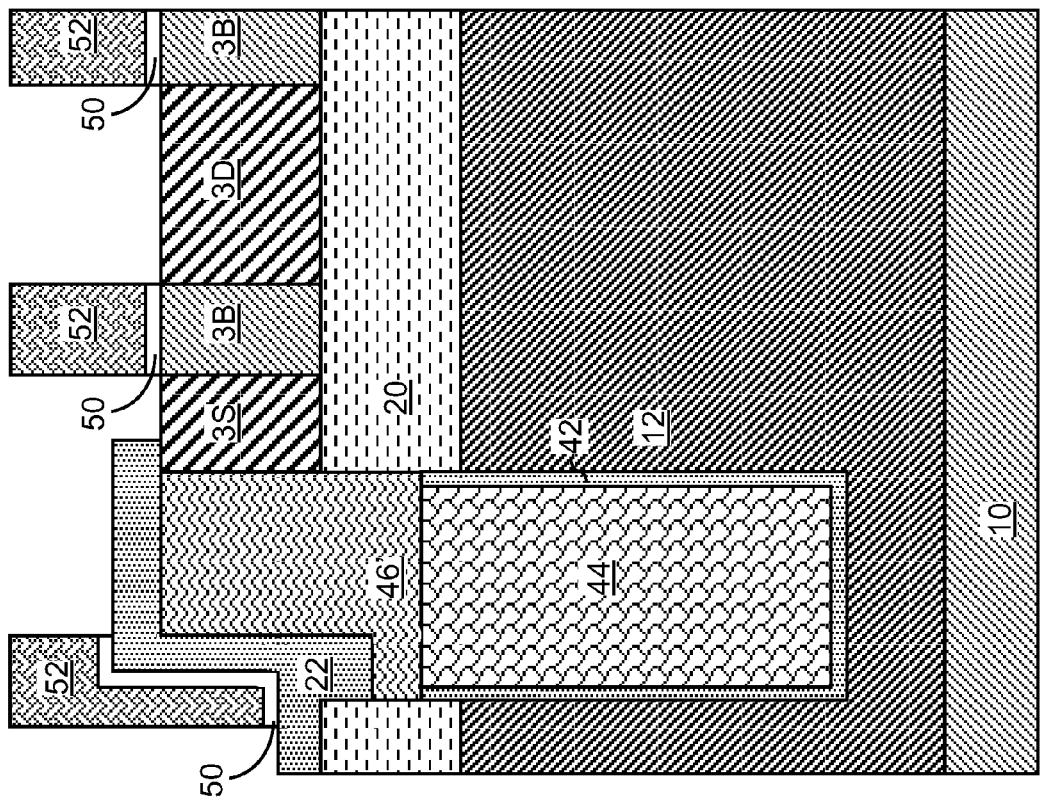
FIG. 11C
FIG. 11B

US 9,461,050 B2

SELF-ALIGNED LATERALLY EXTENDED STRAP FOR A DYNAMIC RANDOM ACCESS MEMORY CELL

BACKGROUND

The present disclosure relates to a semiconductor structure, and particularly to a dynamic random access memory (DRAM) cell including a self-aligned laterally extended strap to connect an inner electrode of a trench capacitor and a finFET access transistor, and a method of manufacturing the same.

Trench capacitors are used in a variety of semiconductor chips for high areal capacitance and low device leakage. Typically, a trench capacitor provides a capacitance in the range from 4 fF (femto-Farad) to 120 fF. A trench capacitor may be employed as a charge storage unit in a dynamic random access memory (DRAM), which may be provided as a stand-alone semiconductor chip, or may be embedded in a system-on-chip (SoC) semiconductor chip.

A strap structure is employed to electrically connect an inner electrode of a trench capacitor to a source of an access field effect transistor. In the case of an access fin field effect transistor, the strap structure must extend through an insulator layer underlying the access fin field effect transistor to provide electrical connection between the inner electrode of trench capacitor and the source region of the access fin field effect transistor. Because other conductive structures such as passing gate lines are formed near the strap structure, formation of strap structure requires precise alignment of the source region and the inner electrode to avoid unintentional electrical shorts to other conductive structures. Thus, formation of strap structures tends to limit the scaling of a dynamic random access memory cell through overlay limitations with respect to various other conductive structures.

SUMMARY

A self-aligned strap structure can be formed by forming trench capacitors and overlying trench top conductive material portions. End portions of fin mask structures overlie portions of the trench top conductive material portions. A dielectric spacer is formed around each end portions of the fin mask structure to cover additional areas of the trench top conductive material portions. An anisotropic etch is performed to recess portions of the trench top conductive material portions that are not covered by the fin mask structures or dielectric spacers. Conductive strap structures that are self-aligned to end portions of semiconductor fins are formed simultaneously with formation of the semiconductor fins. Access fin field effect transistors can be subsequently formed.

According to an aspect of the present disclosure, a semiconductor structure contains a semiconductor fin, which is located on a substrate and includes a region having a first width and an end portion having a second width that is greater than the first width. The semiconductor structure further contains a trench capacitor located within the substrate. The trench capacitor includes an inner electrode, a node dielectric, and an outer electrode. The semiconductor structure further includes a conductive strap structure. A lower portion of the conductive strap structure vertically contacts the inner electrode and an upper portion of the conductive strap structure laterally contacts the semiconductor fin and includes a portion having the second width.

According to another aspect of the present disclosure, a method of forming a semiconductor structure is provided. A trench capacitor is formed in a semiconductor substrate. A conductive material portion is formed on an inner electrode of the trench capacitor. A fin mask structure is formed over the semiconductor substrate. A dielectric spacer is formed around an end portion of the fin mask structure. The dielectric spacer overlies a portion of the conductive material portion and a portion of a semiconductor layer laterally surrounding the conductive material portion. The conductive material portion is patterned by an anisotropic etch employing a combination of the fin mask structure and the dielectric spacer as an etch mask. A conductive strap structure is formed by a remaining portion of the conductive material portion.

BRIEF DESCRIPTION OF SEVERAL VIEWS OF THE DRAWINGS

FIG. 1B is a vertical cross-sectional view of the exemplary semiconductor structure along the vertical plane B-B' of FIG. 1A.

FIG. 1C is a vertical cross-sectional view of the exemplary semiconductor structure along the vertical plane C-C' of FIG. 1A.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane B-B' of FIG. 2A.

FIG. 5B is a vertical cross-sectional view of the exemplary semiconductor structure along the vertical plane B-B' of FIG. 5A.

FIG. 5C is a vertical cross-sectional view of the exemplary semiconductor structure along the vertical plane C-C' of FIG. 5A.

FIG. 6B is a vertical cross-sectional view of the exemplary semiconductor structure along the vertical plane B-B' of FIG. 6A.

FIG. 6C is a vertical cross-sectional view of the exemplary semiconductor structure along the vertical plane C-C' of FIG. 6A.

FIG. 9B is a vertical cross-sectional view of the exemplary semiconductor structure along the vertical plane B-B' of FIG. 9A.

FIG. 9C is a vertical cross-sectional view of the exemplary semiconductor structure along the vertical plane C-C' of FIG. 9A.

FIG. 9D is a vertical cross-sectional view of the exemplary semiconductor structure along the vertical plane D-D' of FIG. 9A.

FIG. 10B is a vertical cross-sectional view of the exemplary semiconductor structure along the vertical plane B-B' of FIG. 10A.

FIG. 10C is a vertical cross-sectional view of the exemplary semiconductor structure along the vertical plane C-C' of FIG. 10A.

FIG. 10D is a vertical cross-sectional view of the exemplary semiconductor structure along the vertical plane D-D' of FIG. 10A.

FIG. 11B is a vertical cross-sectional view of the exemplary semiconductor structure along the vertical plane B-B' of FIG. 11A.

FIG. 11C is a vertical cross-sectional view of the exemplary semiconductor structure along the vertical plane C-C' of FIG. 11A.

DETAILED DESCRIPTION

Figure 1A:
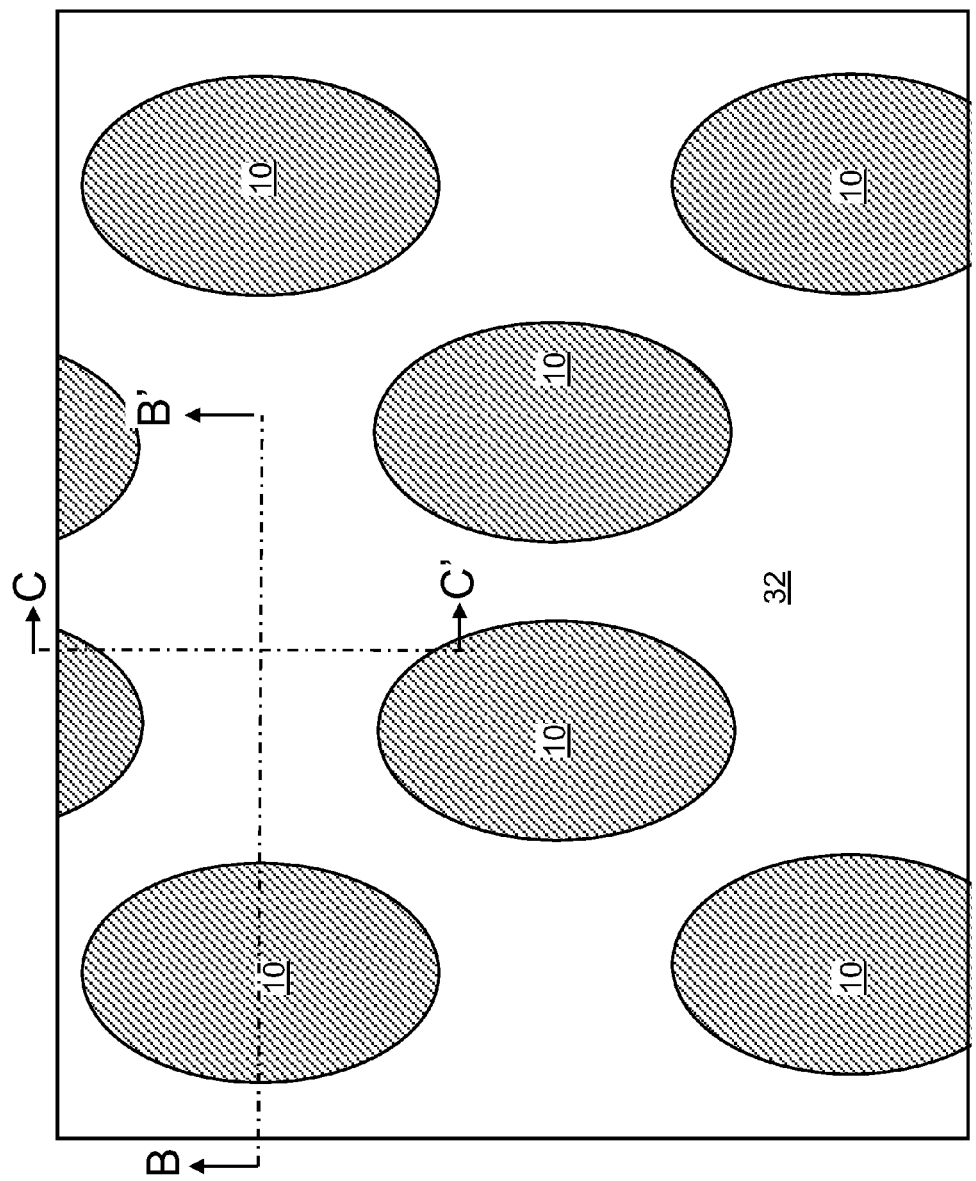
FIG. 1A is a top-down view of an exemplary semiconductor structure after formation of trenches according to an embodiment of the present disclosure.

As stated above, the present disclosure relates to a dynamic random access memory (DRAM) cell including a self-aligned laterally extended strap to connect an inner electrode of a trench capacitor and a finFET access transistor, and a method of manufacturing the same. These aspects of the present disclosure are now described in detail with accompanying figures. It is noted that like reference numerals refer to like elements across different embodiments. The drawings are not necessarily drawn to scale.

Referring to FIGS. 1A-1C, an exemplary semiconductor structure according to an embodiment of the present disclosure includes a semiconductor substrate, which can be a semiconductor-on-insulator (SOI) substrate or a bulk semiconductor substrate. If the semiconductor substrate is an SOI substrate, the semiconductor substrate can include a bottom semiconductor layer 10, a buried insulator layer 20, and a top semiconductor layer 30L. If the semiconductor substrate is a bulk semiconductor substrate, the entirety of the semiconductor substrate can include a semiconductor material portion. Each of the top semiconductor layer 30L, the bottom semiconductor layer 10, and the bulk semiconductor substrate includes a semiconductor material, which can be selected from elemental semiconductor materials (e.g., silicon, germanium, carbon, or alloys thereof), III-V semiconductor materials, or II-VI semiconductor materials. Each semiconductor material may be a single crystalline semiconductor material.

While the present disclosure is described employing an SOI substrate, embodiments in which a bulk semiconductor substrate is employed in lieu of an SOI substrate is expressly contemplated herein.

A dielectric mask layer 32 can be formed on the top surface of the semiconductor substrate (10, 20, 30L). The dielectric mask layer 32 can include a dielectric material that can be subsequently employed as an etch mask layer for forming trenches 11.

A photoresist layer (not shown) can be applied over the dielectric mask layer 32, and can be lithographically patterned to form openings corresponding to the areas of trenches 11 to be subsequently formed. The pattern in the photoresist layer can be transferred into the dielectric mask layer 32 by a pattern transfer etch, which can be an anisotropic etch that employs the photoresist layer as an etch mask. Subsequently, the pattern in the dielectric mask layer 32 can be transferred through the top semiconductor layer 30L, the buried insulator layer 20, and an upper portion of the bottom semiconductor layer 10 by an anisotropic etch that employs the dielectric mask layer 32 as an etch mask. If a bulk semiconductor substrate is employed, the pattern in the dielectric mask layer 32 can be transferred into an upper portion of the bulk semiconductor substrate. A trench 11 can be formed for each opening in the dielectric mask layer 32. The photoresist can be removed by ashing, or can be consumed during the etch process that forms the trenches 11. The dielectric mask layer 32 can be a combination of multiple layers including different materials.

The sidewalls of each trench 11 can be substantially vertically coincident among the various layers (30L, 20, 10) through which the trench 11 extends. As used herein, sidewalls of multiple elements are "vertically coincident" if the sidewalls of the multiple elements overlap in a top-down view. As used herein, sidewalls of multiple elements are "substantially vertically coincident" if the lateral offset of the sidewalls of the multiple elements from a perfectly vertical surface is within three times the root mean square of surface roughness of sidewalls of each element. In one embodiment, the trenches 11 can have an elliptical horizontal cross-sectional shape.

The depth of each trench 11 as measured from the plane of the topmost surface of the semiconductor substrate (30L, 20, 10) to the bottom surface of the trench 11 can be from 500 nm to 10 microns, although lesser and greater depths can also be employed. In one embodiment, the trenches 11 can be deep trenches. As used herein, a "deep trench" refers to a trench that having a depth greater than 2.0 microns, which is the maximum depth for ion implantation as known in the art. The lateral dimensions of each trench 11 can be limited by the lithographic capabilities, i.e., the ability of a lithographic tool to print the image of an opening on the photoresist layer.

Figure 2A:
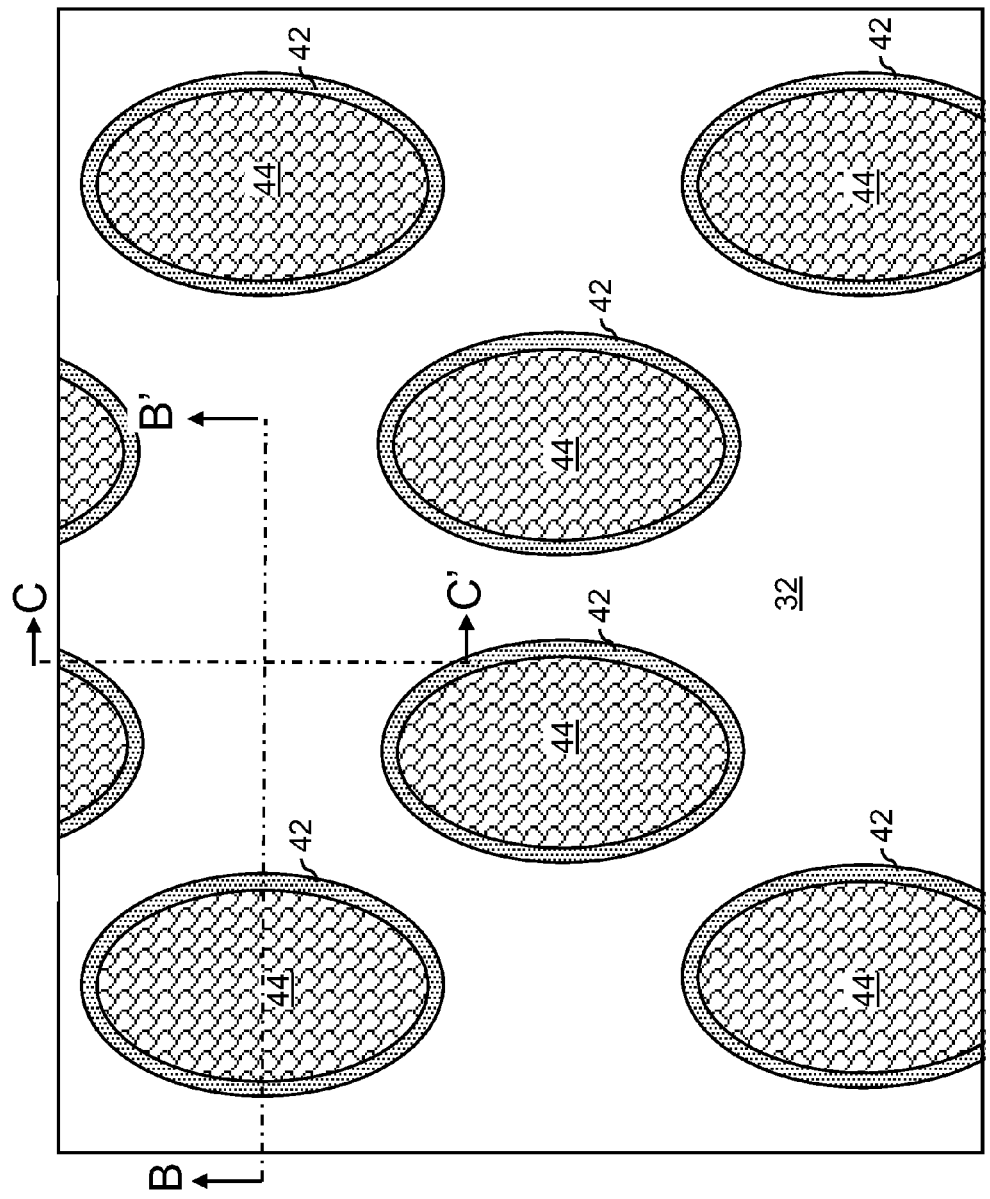
FIG. 2A is a top-down view of the exemplary semiconductor structure after formation of trench capacitors according to an embodiment of the present disclosure.

Referring to FIGS. 2A-2C, trench capacitors (12, 42, 44) can be formed in each trench 11. For example, a buried plate 12 can be formed by doping a portion of the bottom semiconductor layer 10 in proximity of sidewalls of each trench 11. If the bottom semiconductor layer 10 as provided is doped with dopants, the conductivity type of the bottom semiconductor layer 10 as provided is herein referred to as a first conductivity type. Dopants can be introduced, for example, by outdiffusion from a dopant-including disposable material (such as a doped silicate glass) or by ion implantation as known in the art. Further, any other method of forming a buried plate 12 in bottom semiconductor layer 10 of bottom semiconductor layer 10 can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric 42 can be deposited conformally on all physically exposed sidewalls in each trench 11 and on the top surface of the dielectric mask layer 32. The node dielectric 42 can include any dielectric material that can be employed as a node dielectric material in a capacitor known in the art. For example, the node dielectric 42 can include at least one of silicon nitride and a dielectric metal oxide material such as high dielectric constant (high-k) gate dielectric material as known in the art.

A conductive material can be deposited to completely fill each trench 11. The conductive material can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to fill each trench 11 completely.

Excess portions of the conductive material can be removed from above the top surface of the dielectric mask layer 32, for example, by chemical mechanical planarization. Subsequently, the conductive material can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 42.

An inner electrode 44 including the conductive material is formed in each trench 11. The topmost surface of the inner electrode 44 is substantially planar, and is located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A cavity 45 is formed above each inner electrode 44.

The physically exposed portions of the node dielectrics 42 can be removed by an etch, which can be a wet etch. For example, if the node dielectrics 42 include silicon nitride, the physically exposed portions of the node dielectric 42 can be removed by a wet etch employing hot phosphoric acid. Each remaining portion of the node dielectric 42 within each trench 11 constitutes a node dielectric 42. Each adjoined set of a buried plate 12, a node dielectric 42, and an inner electrode 44 constitute a trench capacitor (12, 42, 44). Each buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the combination of bottom semiconductor layer 10 and the buried insulator layer 20. The buried insulator layer 20 overlies the buried plate 12 (i.e., the outer electrode).

Figure 3A:
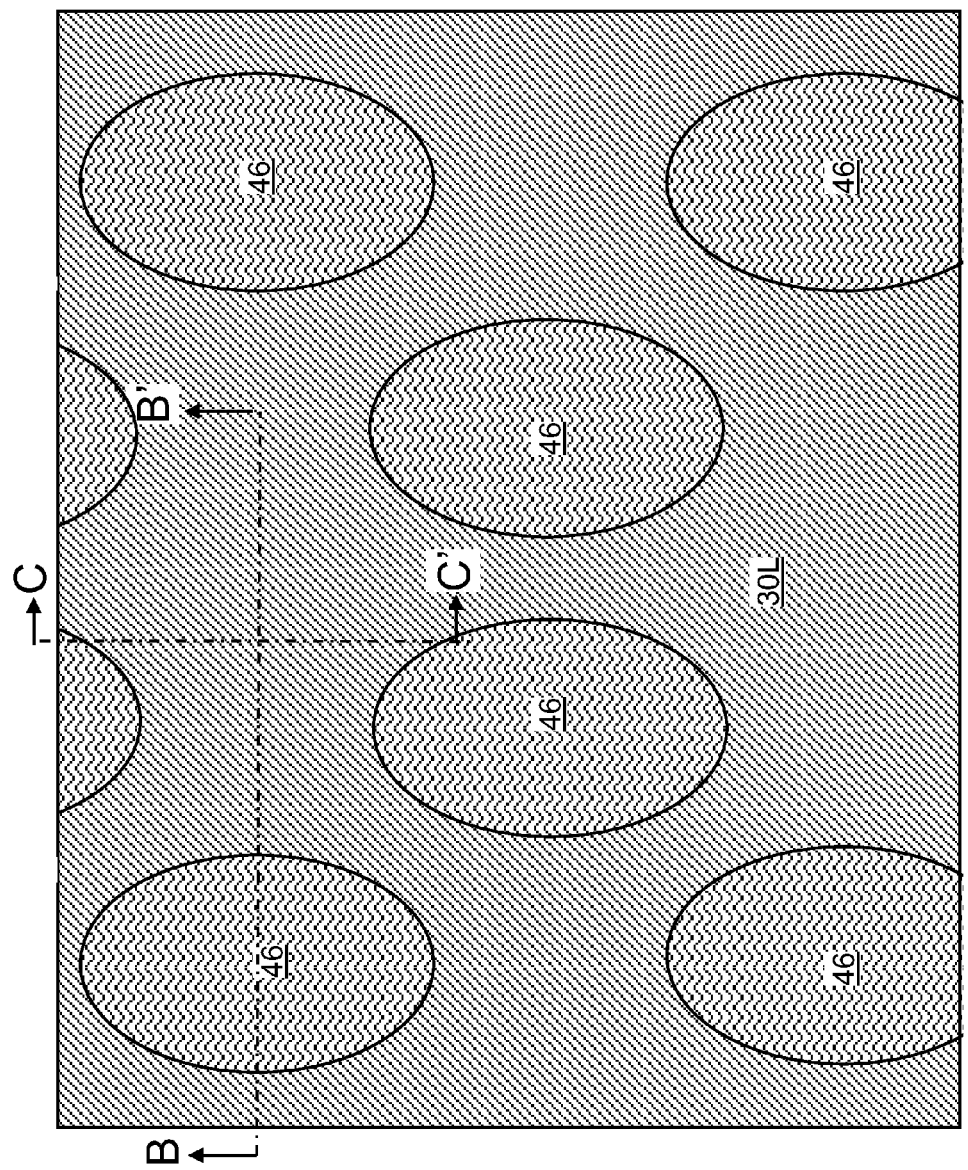
FIG. 3A is a top-down view of the exemplary semiconductor structure after formation of conductive material portions according to an embodiment of the present disclosure.
Figure 3C:
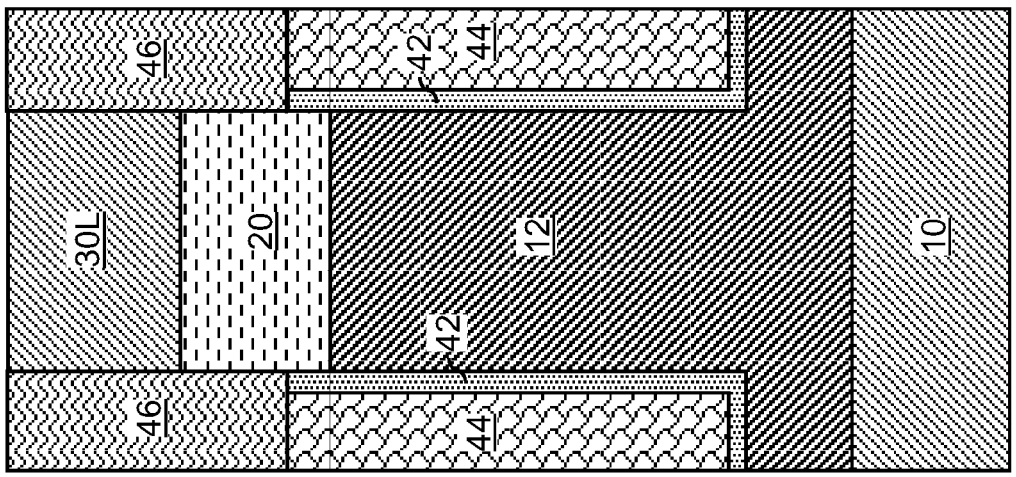
FIG. 3C is a vertical cross-sectional view of the exemplary semiconductor structure along the vertical plane C-C' of FIG. 3A.
Figure 3B:
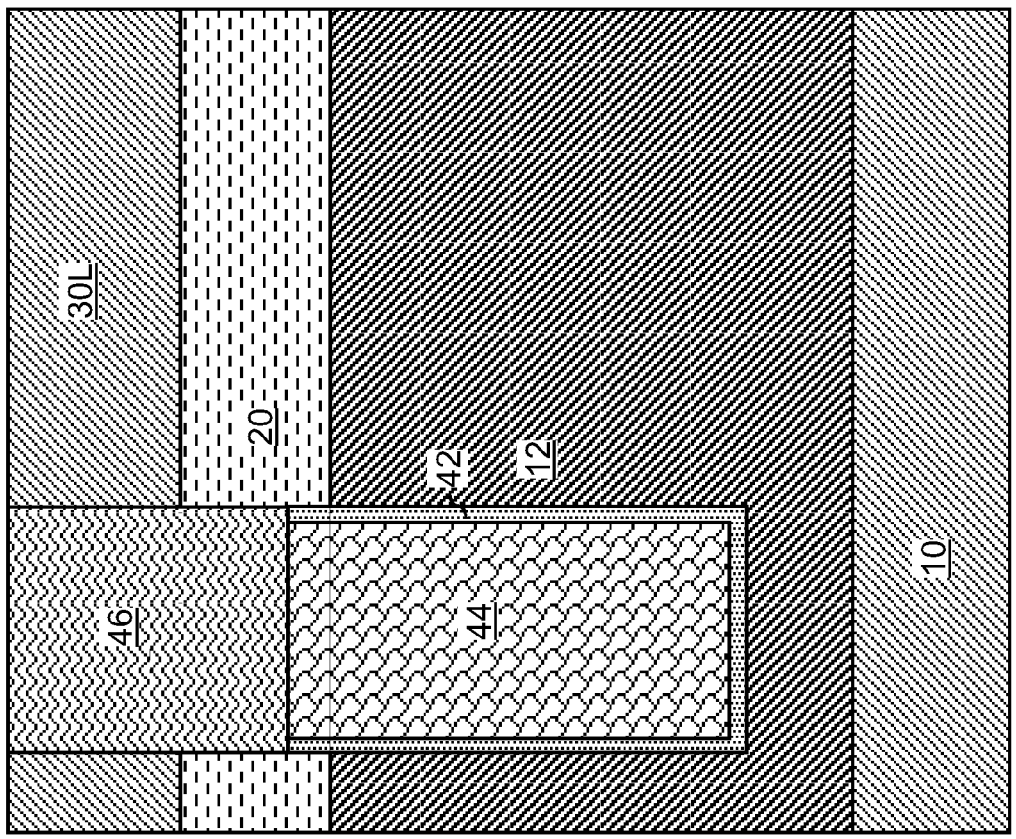
FIG. 3B is a vertical cross-sectional view of the exemplary semiconductor structure along the vertical plane B-B' of FIG. 3A.

Referring to FIGS. 3A-3C, conductive material portions 46 are formed on each inner electrode 44 by deposition of a conductive material in the cavities 45 and removal of excess portions of the conductive material from above the top surface of the top semiconductor layer 30L by planarization. The conductive material can include a doped semiconductor material such as doped polysilicon, a conductive metallic nitride such as tantalum nitride or titanium nitride, a conductive metal, an intermetallic alloy, or a combination thereof. The conductive material can be deposited by chemical vapor deposition (CVD), physical vapor deposition (PVD), atomic layer deposition (ALD), or a combination thereof. The removal of the excess portions of the conductive material from above the top surface of the top semiconductor layer 30L cab be performed, for example, by chemical mechanical planarization (CMP). The top surface of each conductive material portion 46 can be coplanar with the top surface of the top semiconductor layer 30L. The coplanar structure can be formed by a recess etching of inner electrode 46 to the level of top of semiconductor later 30L and removal of hard mask 32 as an example. The outer periphery of each conductive material portion 46 is vertically coincident with outer sidewalls of a node dielectric 42.

Figure 4A:
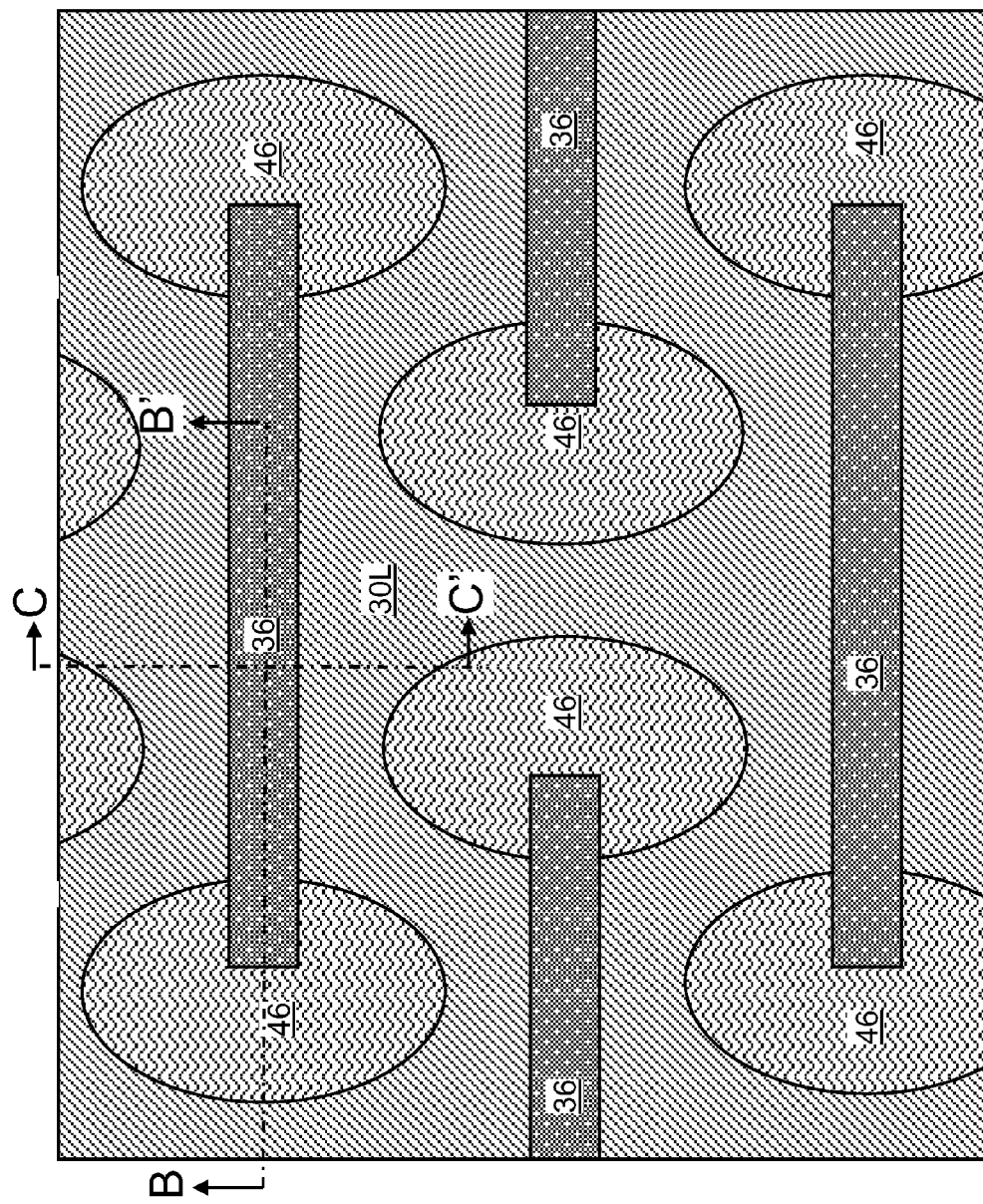
FIG. 4A is a top-down view of the exemplary semiconductor structure after formation of fin mask structures according to an embodiment of the present disclosure.
Figure 4C:
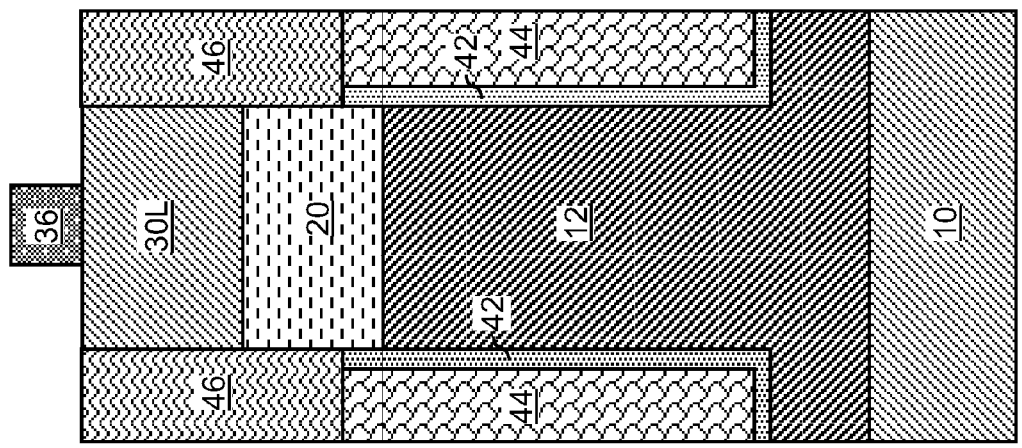
FIG. 4C is a vertical cross-sectional view of the exemplary semiconductor structure along the vertical plane C-C' of FIG. 4A.
Figure 4B:
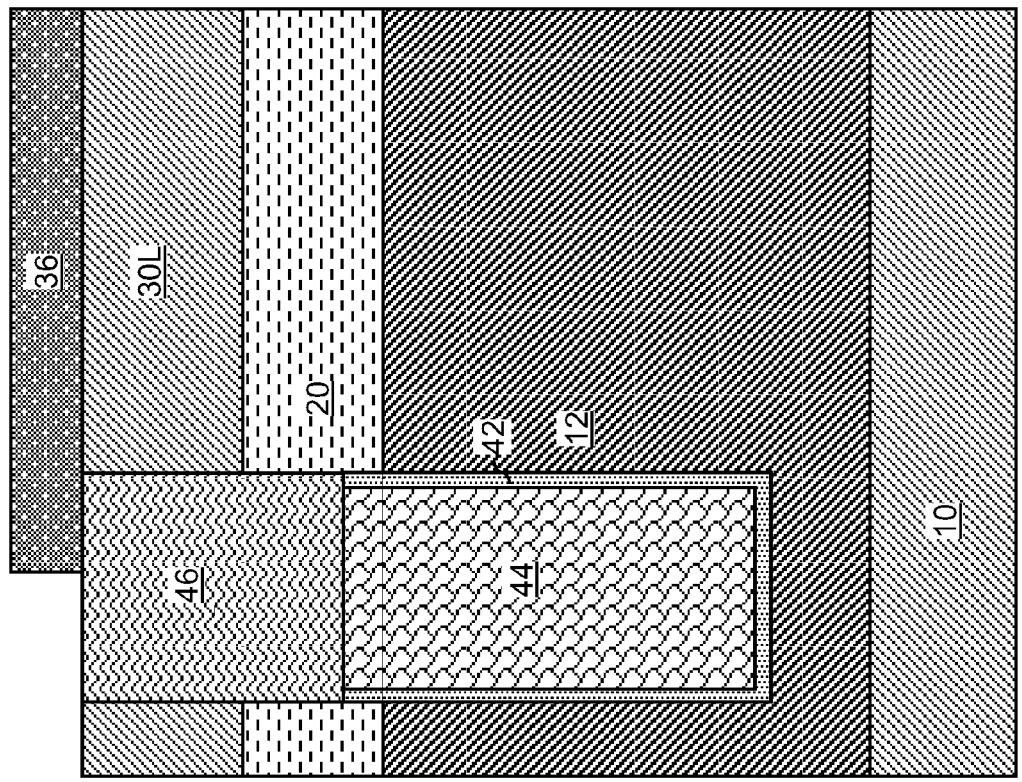
FIG. 4B is a vertical cross-sectional view of the exemplary semiconductor structure along the vertical plane B-B' of FIG. 4A.

Referring to FIGS. 4A and 4B, fin mask structures 36 are formed on the top surface of the top semiconductor layer 30L. Upon formation of the fin mask structures 36, a portion of each fin mask structure 36 can overlie, and contact, at least one conductive material portion 46 and a portion of the top semiconductor layer 30L, which laterally surround the conductive material portions 46. In one embodiment, a fin mask structure 36 can overlie a pair of conductive material portions 46.

In one embodiment, the fin mask structures 36 can be patterned portions of a dielectric material layer. The fin mask structures 36 can be formed, for example, by deposition and patterning of a dielectric material layer. The dielectric material layer includes a dielectric material such as silicon oxide, silicon nitride, a dielectric metal oxide, or a combination thereof. The dielectric layer can be a combination of different dielectric materials. The dielectric material layer can be deposited by chemical vapor deposition (CVD) or atomic layer deposition (ALD). The patterning of the dielectric material layer can be performed, for example, by application and lithographic patterning of a photoresist layer, and transfer of the patterns in the photoresist layer into the dielectric material layer by an etch, which can be an anisotropic etch such as a reactive ion etch. More complicated methods such as a side wall image transfer (SIT) method described in U.S. Pat. No. 6,875,703, can be used to form sub-ground rule fin dimensions. Remaining portions of the photoresist layer can be removed, for example, by ashing. The thickness of the fin mask structures 36 can be in a range from 10 nm to 200 nm, although lesser and greater thicknesses can also be employed. In one embodiment, the fin mask structures 36 can include silicon nitride or a dielectric metal oxide such as hafnium oxide.

In one embodiment, the fin mask structures 36 can have rectangular horizontal cross-sectional shapes, i.e., horizontal cross-sectional shapes of rectangles. In one embodiment, a plurality of fin mask structures 36 having rectangular horizontal cross-sectional shapes can be formed. In one embodiment, a lengthwise direction of a fin mask structure 36 and a vertical direction passing through a geometrical center of a conductive material portion that the fin mask structure 36 contacts can be contained within a same vertical planar plane. As used herein, a "planar plane" refers to a flat Euclidean plane without any curvature therein. As used herein, a "lengthwise direction" of an element refers to the direction that is parallel to the axis passing through the center of mass of the element and around which the moment of inertia of the element is minimized. A widthwise direction of an element refers to a horizontal direction that is perpendicular to the lengthwise direction. A "lengthwise sidewall" of an element refers to a sidewall that extends along the lengthwise direction of the element. A "widthwise sidewall" of an element refers to a sidewall that extends along the widthwise direction of the element.

Each fin mask structure 36 can straddle one or two of the non-planar vertical interfaces, which are present between the top semiconductor layer 30L and the conductive material portions 46. In one embodiment, two end portions of a fin mask structure 36 can overlie, and contact, two conductive material portions 46.

Figure 5A:
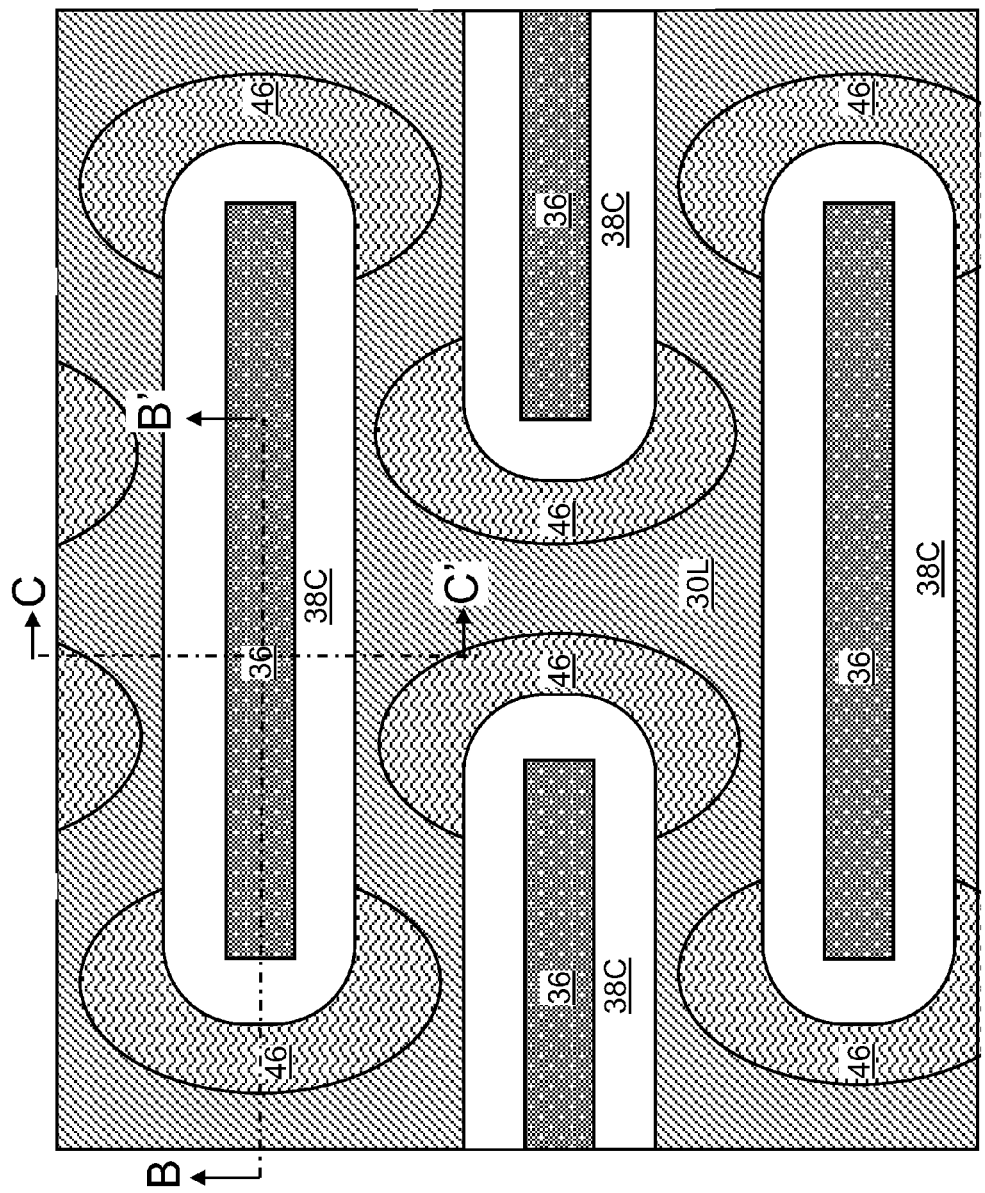
FIG. 5A is a top-down view of the exemplary semiconductor structure after formation of contiguous dielectric spacers around the fin mask structures according to an embodiment of the present disclosure.

Referring to FIGS. 5A-5C, contiguous dielectric spacers 38C are formed around the fin mask structures 36 by deposition of a conformal dielectric material layer and a subsequent anisotropic etch that removes horizontal portions of the conformal dielectric material layer. The conformal dielectric material layer includes a dielectric material that is different from the dielectric material of the fin mask structures 36. For example, the conformal dielectric material layer can include silicon oxide or organosilicate glass (OSG). The conformal dielectric material layer can be deposited employing a conformal deposition method such as atomic layer deposition (ALD) and/or chemical vapor deposition (CVD). The conformal dielectric material can be a combination of different dielectric materials such as a stack of silicon oxide and silicon nitride. The thickness of the conformal dielectric material layer can be in a range from 1 nm to 50 nm, although lesser and greater thicknesses can also be employed. Each remaining vertical portion of the conformal dielectric material layer constitutes a contiguous dielectric spacer 38C. The lateral thickness of the contiguous dielectric spacer 38C, as measured laterally from a sidewall of a fin mask structure 36, can be the same as the thickness of the conformal dielectric material layer.

Each contiguous dielectric spacer 38C laterally surrounds a fin mask structure 36. Each contiguous dielectric spacer 38C can be topologically homeomorphic to a torus, i.e., can be continuously stretched into the shape of a torus without creating or destroying a hole within the structure. The outer sidewalls of each contiguous dielectric spacer 38C can be laterally spaced from the fin mask structure 36 laterally enclosed by the contiguous dielectric spacer 38C by a same distance. Thus, if a fin mask structure 36 has a rectangular horizontal cross-sectional shape, the contiguous dielectric spacer 38C laterally surrounding the fin mask structure 36 can have a cross-sectional shape of a rounded rectangle, i.e., a shape that is modified from a rectangle by rounding each of the four corners. In one embodiment, each contiguous dielectric spacer 38C can include convex sidewalls that overlie a conductive material portion 46 and are laterally spaced from corners of a fin mask structure 36 by a same distance, which is the thickness of the contiguous dielectric spacer 38C.

Figure 6A:
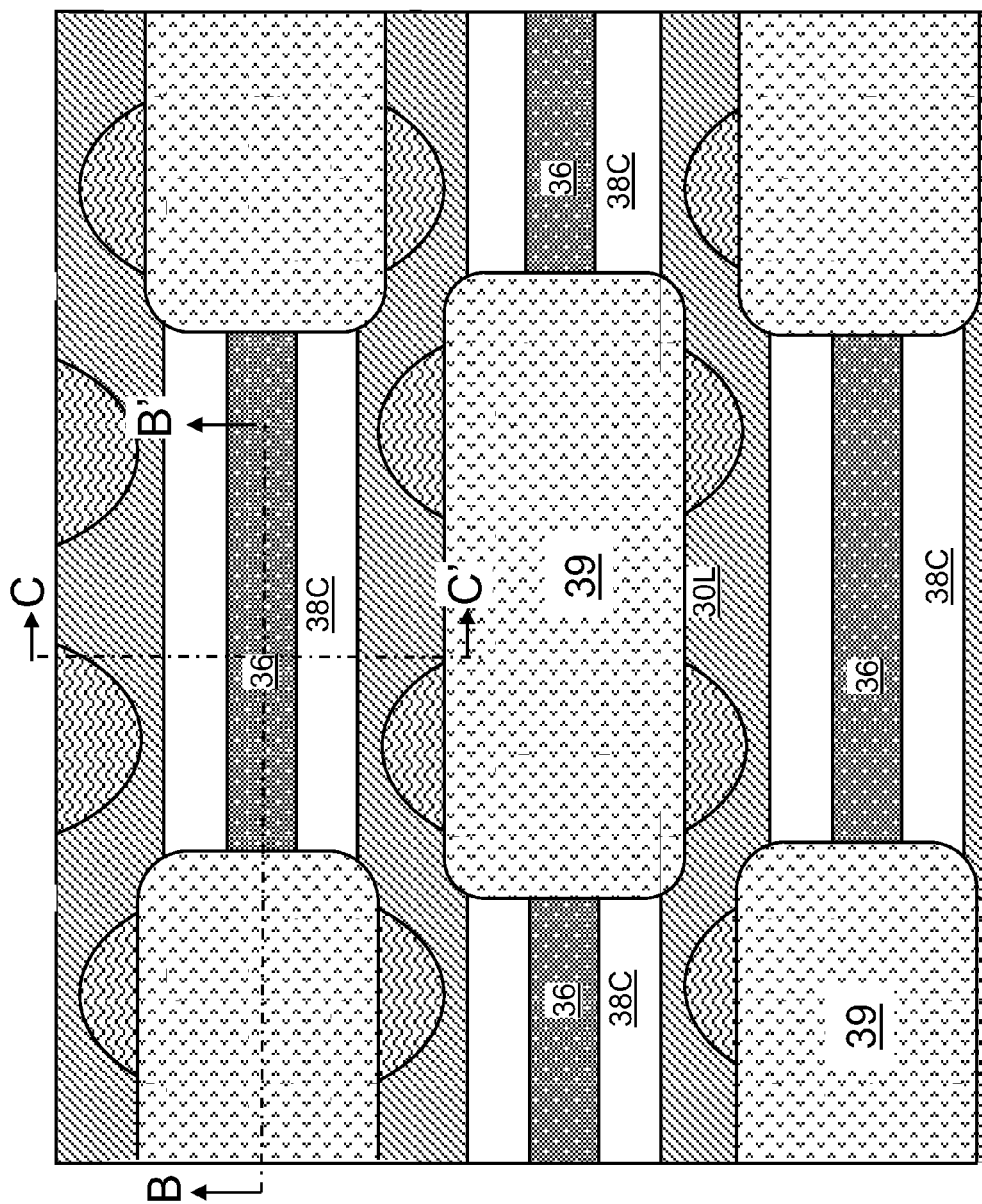
FIG. 6A is a top-down view of the exemplary semiconductor structure after application and patterning of a photoresist layer according to an embodiment of the present disclosure.

Referring to FIGS. 6A-6C, a photoresist layer 39 (39 is resist hole. Surrounding of 39 is photo resist for a clear explanation purpose) is applied and lithographically patterned to cover end portions of each contiguous dielectric spacer 38C, while exposing center portions of each contiguous dielectric spacer 38C overlying the top semiconductor layer 30L. Each end portion of the contiguous dielectric spacers 38C is covered by the lithographically patterned photoresist layer 39, and straddles a non-planar vertical interface between the top semiconductor layer 30L and a conductive material portion 46. All sidewalls of the contiguous dielectric spacer 38C that are perpendicular to the lengthwise direction of the fin mask structures 36 can be covered by the patterned photoresist layer 39. Further, all non-planar vertical surfaces of the contiguous dielectric spacers 38C can be covered by the patterned photoresist layer 39.

Figure 7A:
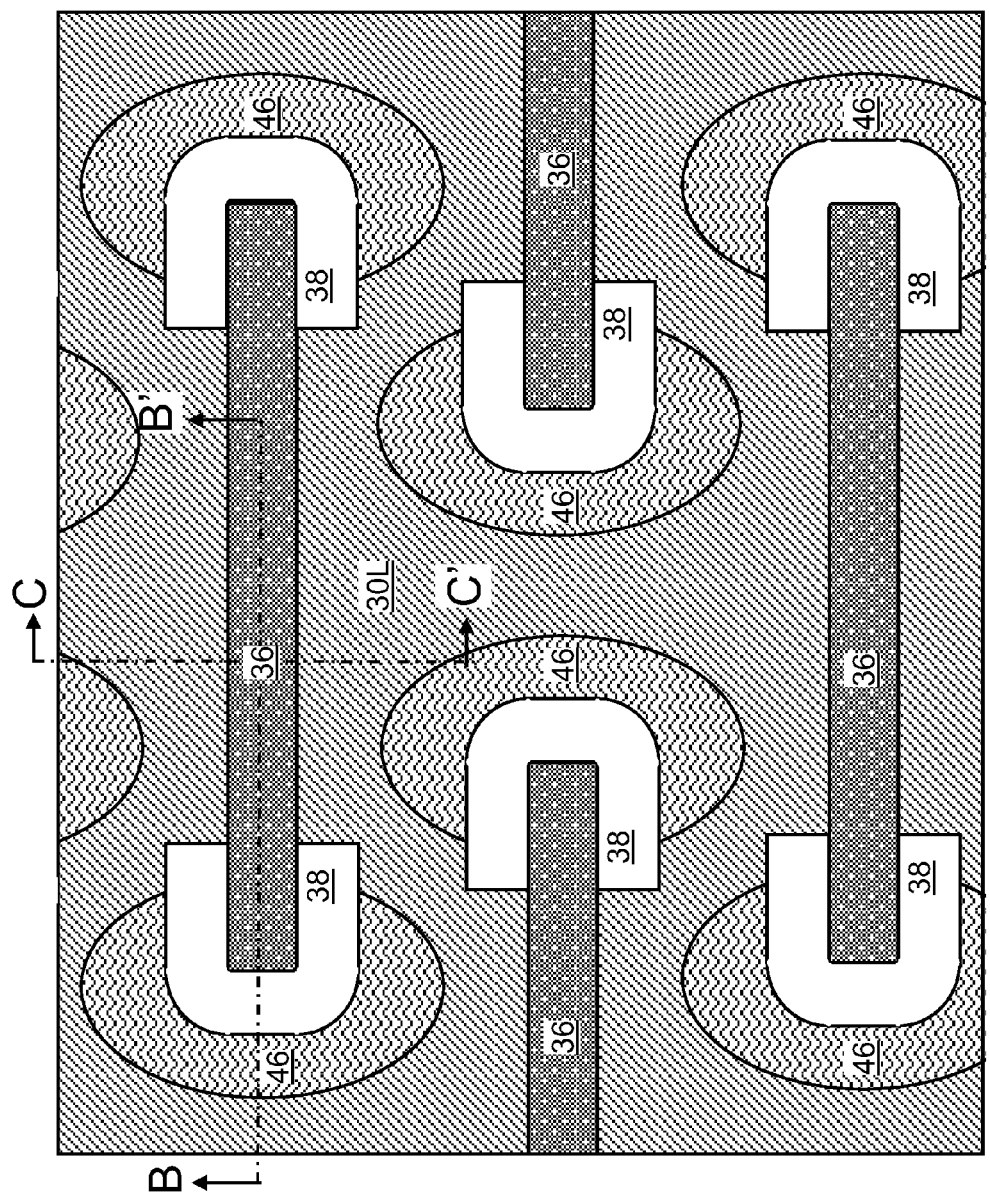
FIG. 7A is a top-down view of the exemplary semiconductor structure removal of unmasked portions of the contiguous dielectric spacers to form dielectric spacers and removal of a patterned photoresist layer according to an embodiment of the present disclosure.
Figure 7C:
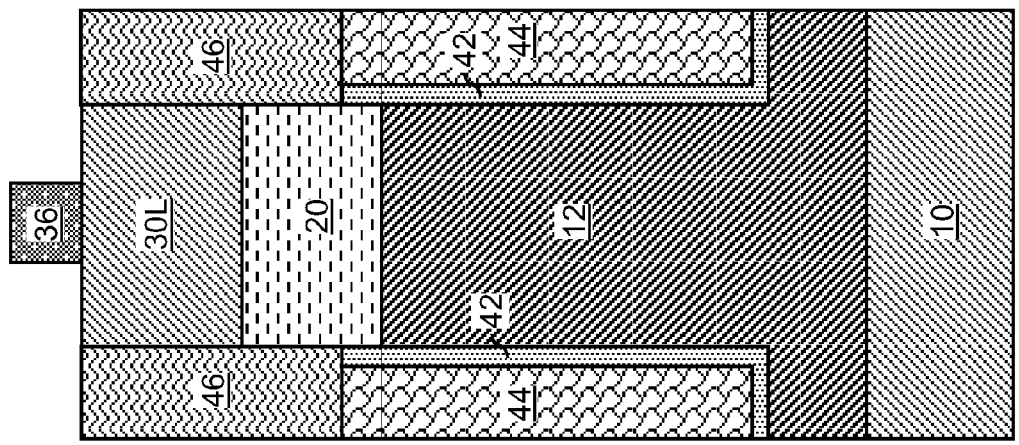
FIG. 7C is a vertical cross-sectional view of the exemplary semiconductor structure along the vertical plane C-C' of FIG. 7A.
Figure 7B:
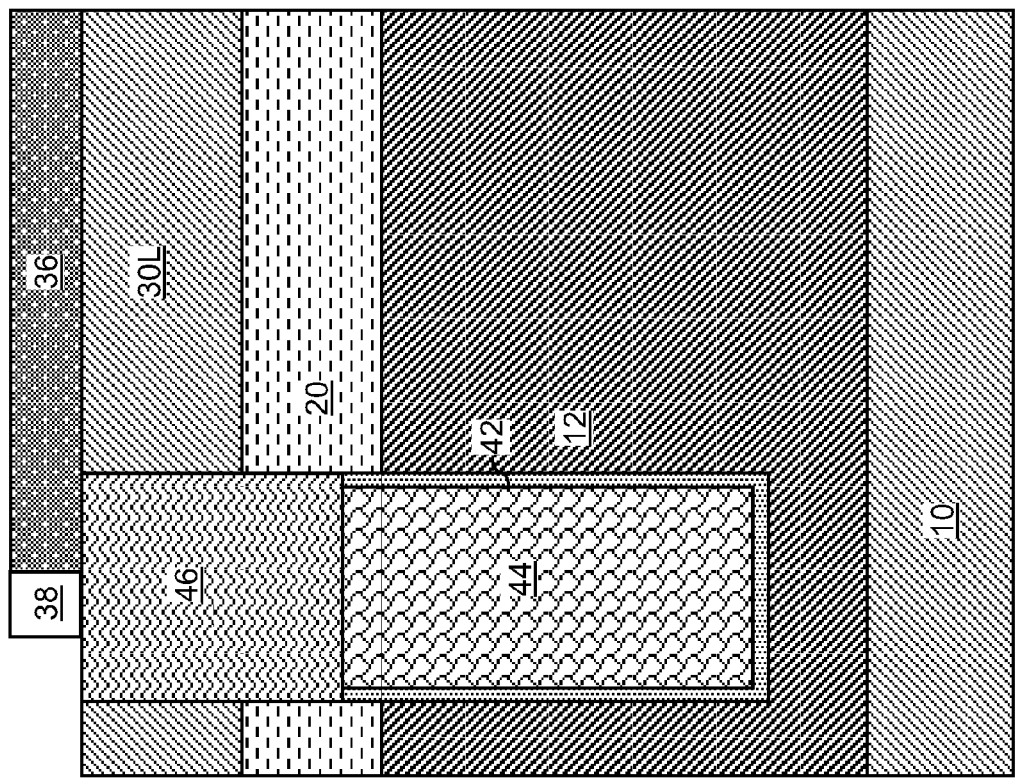
FIG. 7B is a vertical cross-sectional view of the exemplary semiconductor structure along the vertical plane B-B' of FIG. 7A.
Figure 8A:
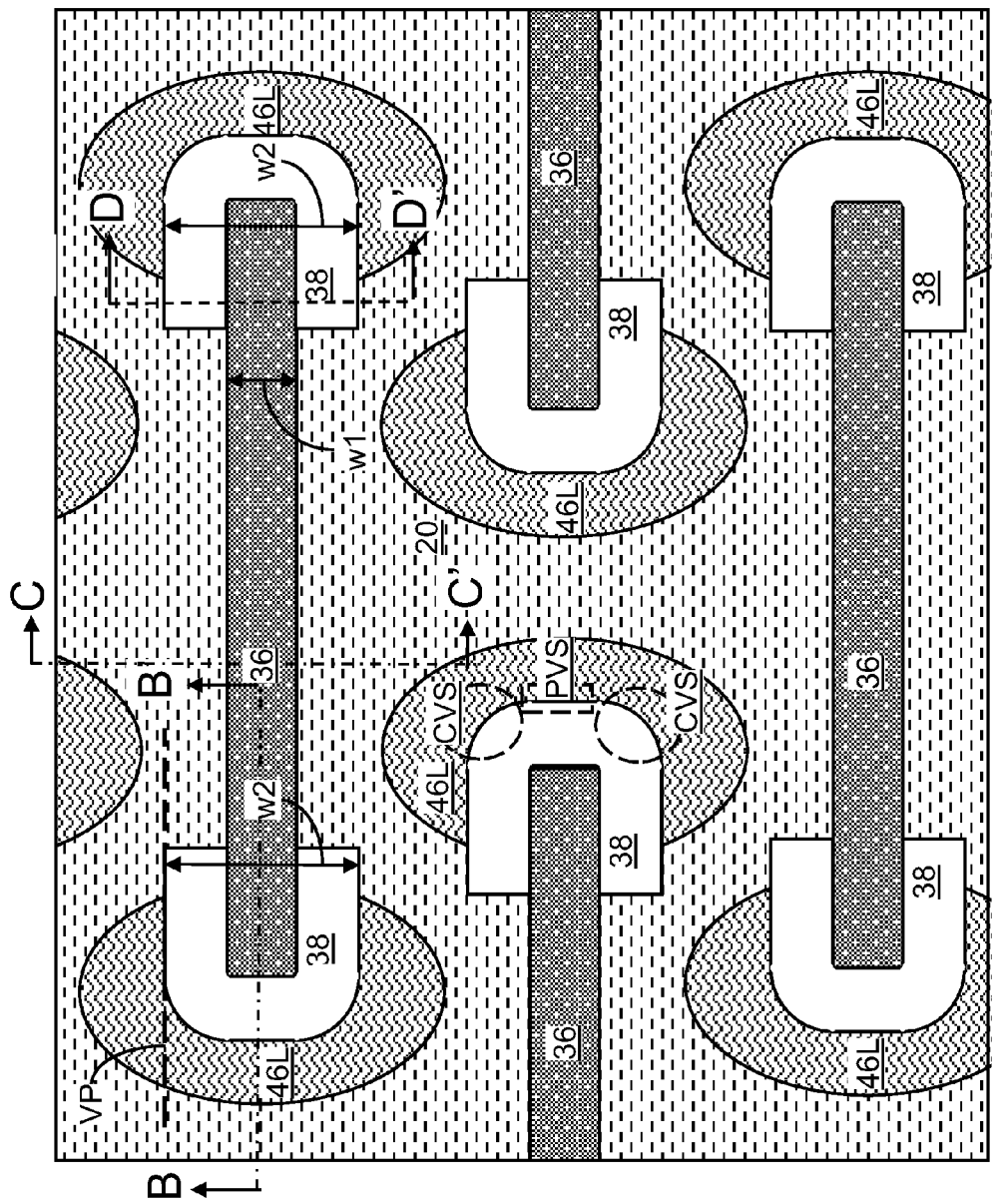
FIG. 8A is a top-down view of the exemplary semiconductor structure after recessing unmasked portions of the conductive material portions to form conductive strap structures according to an embodiment of the present disclosure.
Figures 8B, 8C, 8D:
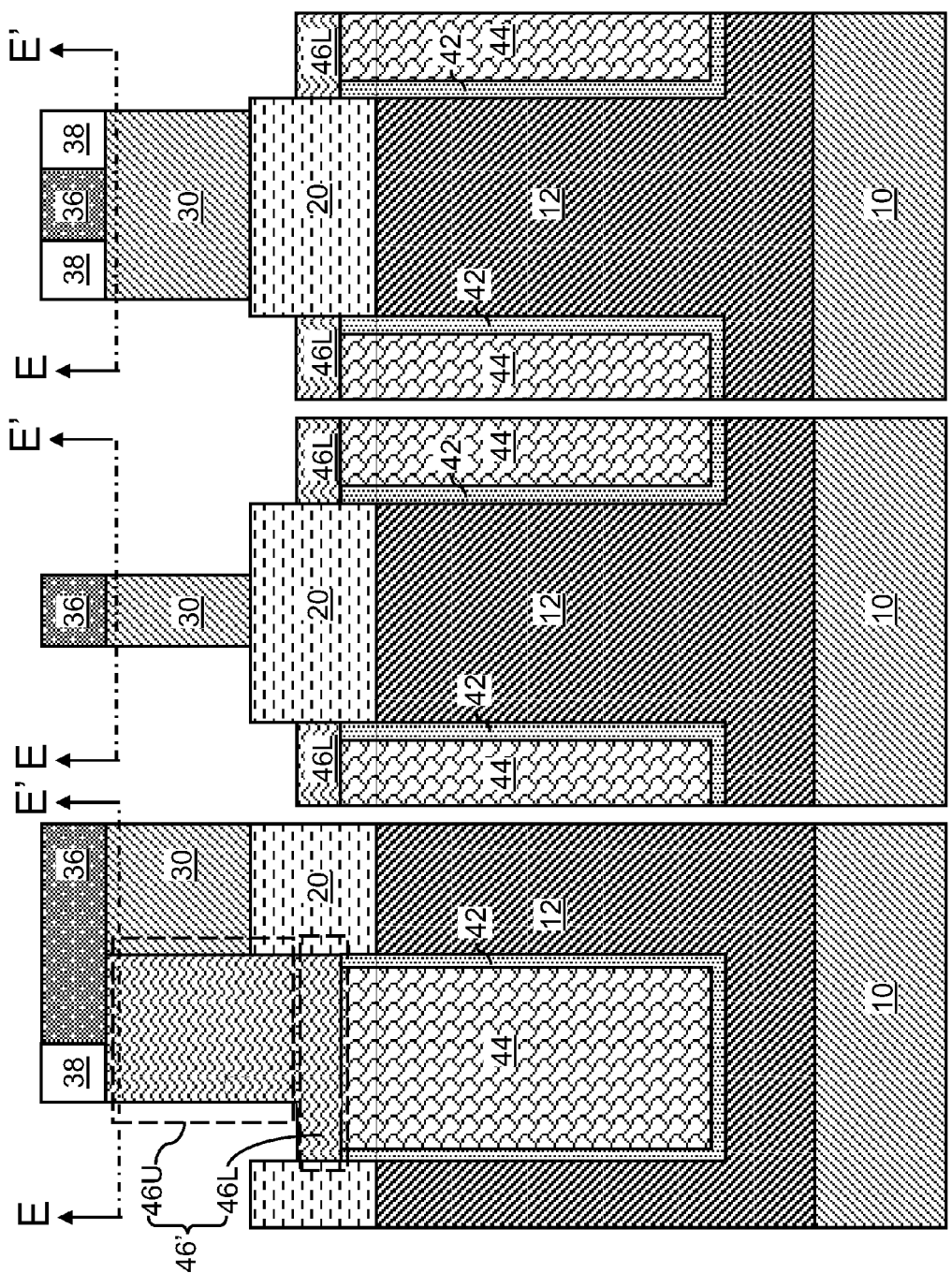
FIG. 8B is a vertical cross-sectional view of the exemplary semiconductor structure along the vertical plane B-B' of FIG. 8A.
FIG. 8C is a vertical cross-sectional view of the exemplary semiconductor structure along the vertical plane C-C' of FIG. 8A.
FIG. 8D is a vertical cross-sectional view of the exemplary semiconductor structure along the vertical plane D-D' of FIG. 8A.
Figure 8E:
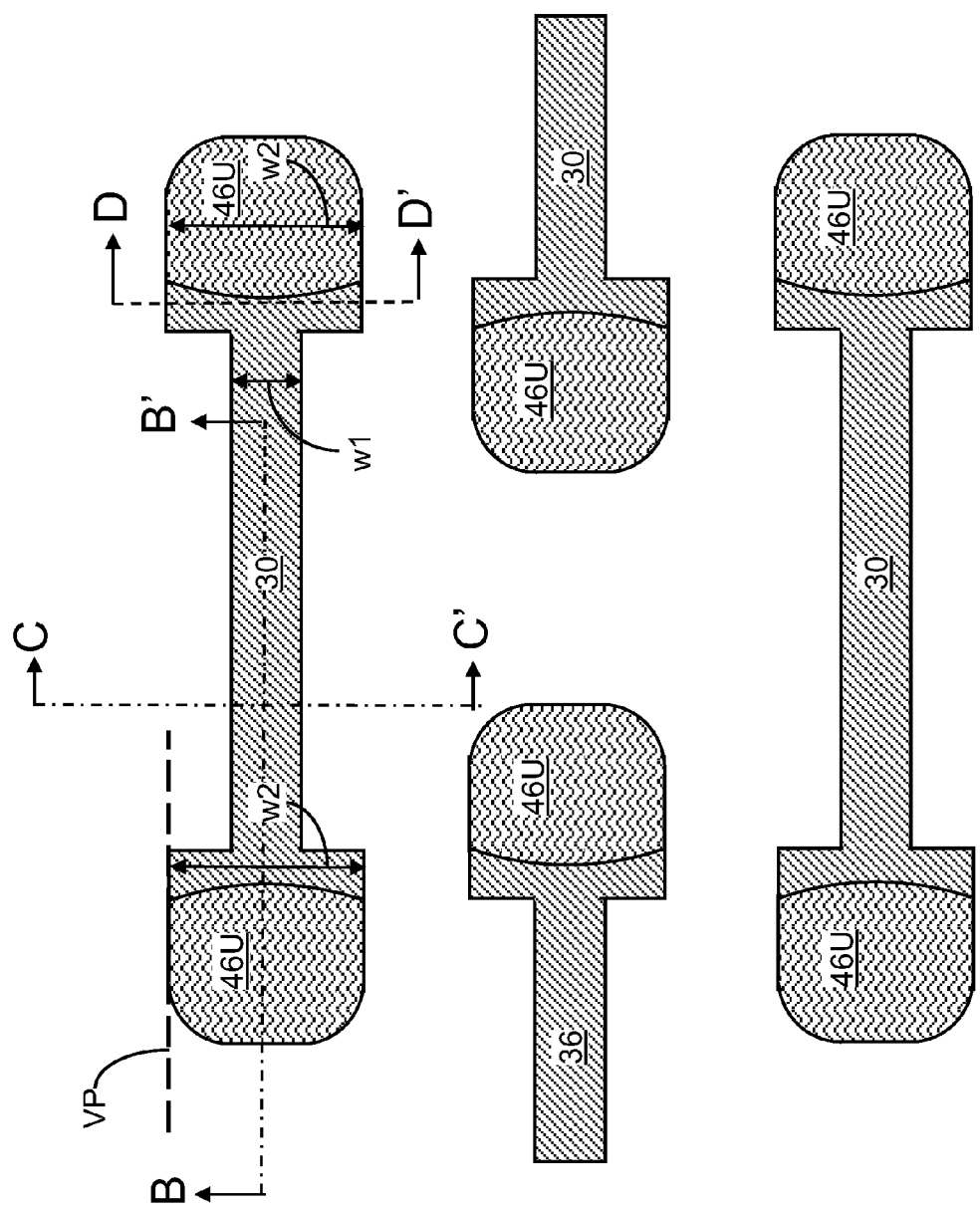
FIG. 8E is a horizontal cross-sectional view of the exemplary semiconductor structure along the horizontal plane E-E' of FIGS. 8B, 8C, and 8D.
Figure 9A:
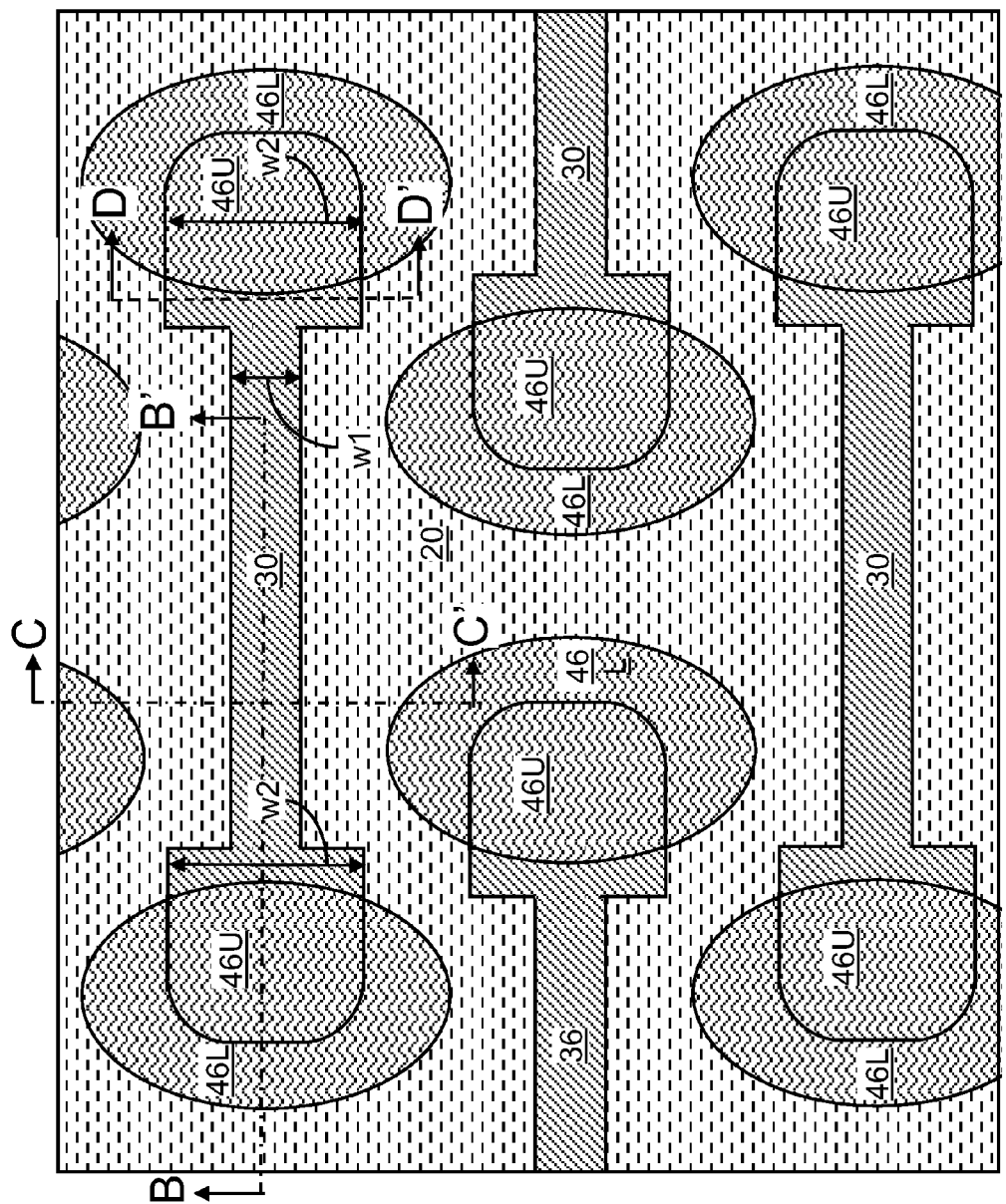
FIG. 9A is a top-down view of the exemplary semiconductor structure after removal of fin mask structures and dielectric structures according to an embodiment of the present disclosure.
Figure 10A:
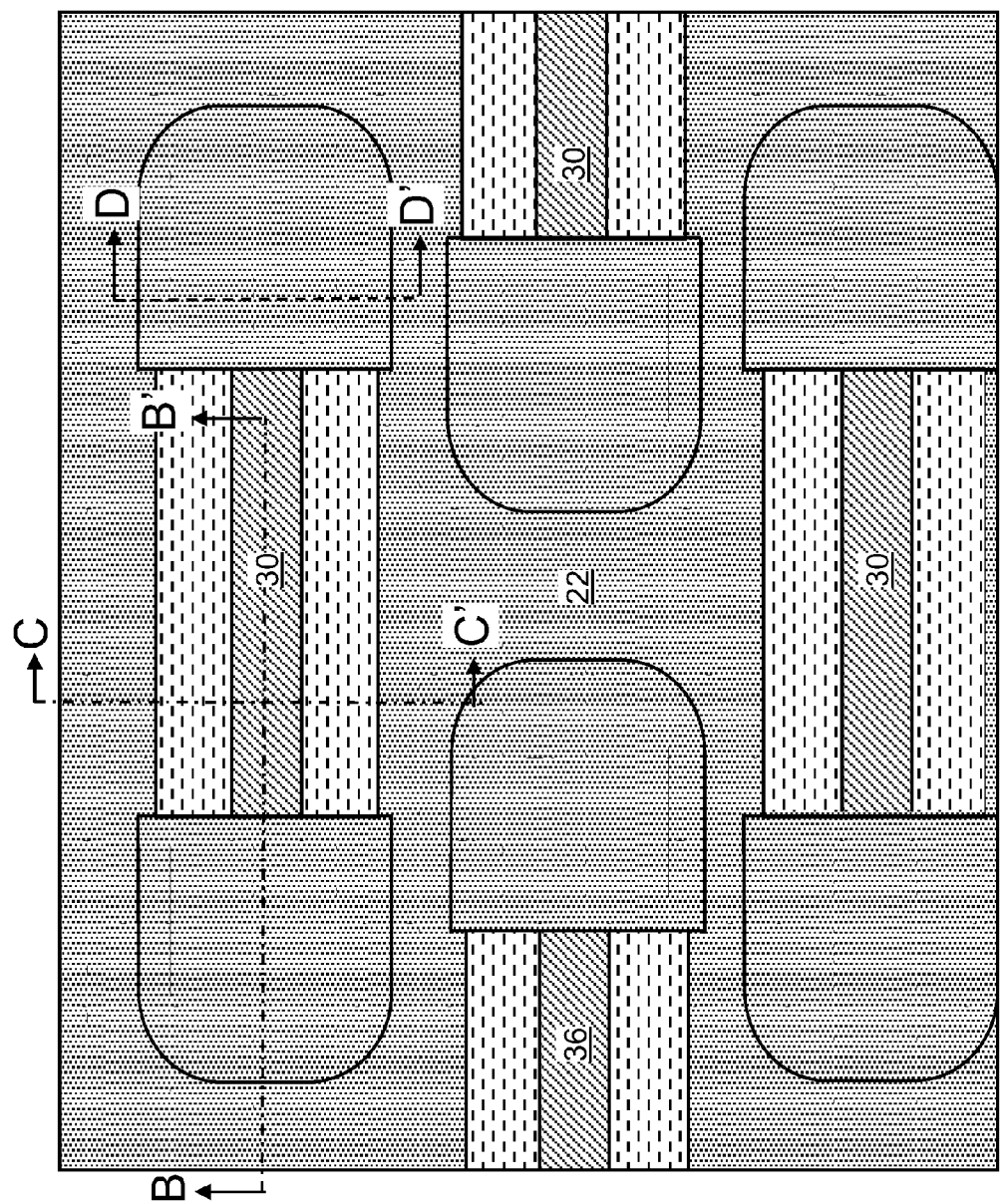
FIG. 10A is a top-down view of the exemplary semiconductor structure after formation of a dielectric material layer filling cavities above recessed portions of the conductive strap structures according to an embodiment of the present disclosure.

Referring to FIGS. 7A-7C, unmasked portions of the contiguous dielectric spacers 38C can be removed, for example, by an etch that employs the photoresist layer 39 as an etch mask. The etch can be selective to the dielectric material of the fin mask structures 36. Further, the etch can be selective to the materials of the top semiconductor layer 30L and the conductive material portions 46. Generally, the fin mask structures 38 can include a first dielectric material, and the contiguous dielectric spacers 38C can include a second dielectric material, and the etch can remove the second dielectric material selective to the first dielectric material.

For each pair of a conductive material portion 46 and a contiguous dielectric spacer 38C that overlies a portion of the conductive material portion 46, a first portion of the contiguous dielectric spacer 38C that is distal from the conductive material portion 46 is removed by an etch, while a second portion of the contiguous dielectric spacer 38C that is proximal to the conductive material portion 46 is protected by the photoresist layer 39. Each contiguous dielectric spacer 38C can be divided into two disjoined remaining portions, which are herein referred to as dielectric spacers 38. Each second portion that remains corresponds to a dielectric spacer 38.

In one embodiment, the etch that removes unmasked portions of the contiguous dielectric spacers 38C can be an anisotropic etch such as a reactive ion etch. In this case, the sidewalls of the photoresist layer 39 can be vertically coincident with sidewalls of the dielectric spacers 38.

Each dielectric spacer 38 is formed around an end portion of a fin mask structure 36, and overlies a portion of a conductive material portion 46 and a portion of the top semiconductor layer 30L. If a sidewall of the photoresist layer 39 overlying a contiguous dielectric spacer 38C is within a planar vertical plane, i.e., a Euclidean vertical plane, a dielectric spacer 38 formed from a portion of the contiguous dielectric spacer 38C that underlies the photoresist layer 39 can have two vertical sidewalls that are within a same vertical plane. In one embodiment, the two vertical sidewalls of a dielectric spacer 38 can have two planar vertical sidewalls that are perpendicular to the lengthwise direction of a fin mask structure 36 that contacts the dielectric spacer 38. The photoresist layer 39 can be subsequently removed, for example, by ashing.

Referring to FIGS. 8A-8E, physically exposed portions of the top semiconductor layer 30L and the conductive material portions 46 are anisotropically etched employing the combination of the fin mask structures 36 and the dielectric spacers 38 as an etch mask. In one embodiment, the anisotropic etch can be selective to the dielectric material of the buried insulator layer 20. In an illustrative example, the top semiconductor layer 30L can be a single crystalline silicon layer, the conductive material portions 46 can include a doped semiconductor material such as doped polysilicon, the fin mask structures 36 can include silicon nitride, the dielectric spacers 38 and the buried insulator layer 20 can include silicon oxide, and the anisotropic etch can employ an etch chemistry that etches the semiconductor materials of the top semiconductor layer 30L and the conductive material portions 46 selective to silicon nitride and silicon oxide.

Each remaining portions of the top semiconductor layer 30L after the anisotropic etch constitutes a semiconductor fin 30. Thus, the top semiconductor layer 30L is patterned into semiconductor fins 30 during the anisotropic etch. As used herein, a "semiconductor fin" refers to a semiconductor material portion having a pair of parallel lengthwise sidewalls that are laterally spaced by a uniform dimension. As used herein, a "fin field effect transistor" refers to a field effect transistor in which at least a body region is located within a semiconductor fin.

Unmasked portions of the conductive material portions 46 are vertically recessed by the anisotropic etch to a depth that is located between the top surface of the buried insulator layer 20 and the bottom surface of the buried insulator layer 20. Thus, each conductive material portion 46 is patterned by the anisotropic etch employing the combination of the fin mask structures 36 and the dielectric spacer 38 as an etch mask. Each remaining portion of a conductive material portion after the anisotropic etch is herein referred to as a conductive strap structure 46'. Each conductive strap structure 46' is formed directly on an inner electrode 44 and a sidewall of a semiconductor fin 30. The width of each semiconductor fin 30 in a region underlying a dielectric spacer 38 is the second width w2, which is greater than the first width w1 in a region of the semiconductor fin 30 that does not underlie the dielectric spacers 38.

The exemplary semiconductor structure includes at least a semiconductor fin 30 located on a substrate (10, 20) and including a region having a first width w1 and an end portion having a second width w2 that is greater than the first width w1. A trench capacitor (12, 42, 44) is located within the substrate (10, 22) and including an inner electrode 44, a node dielectric 42, and an outer electrode, which is a buried plate 12. A lower portion 46L of the conductive strap structure 46' vertically contacts the inner electrode 44, and an upper portion 46U of the conductive strap structure 46' laterally contacts the semiconductor fin 30. The upper portion 46U of the conductive strap structure 46' includes a portion having the second width w2, i.e., the sub-portion of the upper portion 46U that underlies an assembly of a fin mask structure 36 and a dielectric spacer 38.

In one embodiment, a sidewall of the semiconductor fin 30 and a sidewall of the conductive strap structure 46' can be within the same vertical plane VP that extends along the lengthwise direction of the semiconductor fin 30. In one embodiment, a concave vertical sidewall of the semiconductor fin 30 can contact a convex vertical sidewall of the conductive strap structure 46' at an interface between the semiconductor fin 30 and the conductive strap structure 46'. In one embodiment, the convex vertical sidewall of the conductive strap structure 46' can be vertically coincident with the interface between the node dielectric 42 and the outer electrode, i.e., the buried plate 12.

In one embodiment, the entirety of sidewall surfaces of the conductive strap structure 46' can be vertically coincident with an interface between the node dielectric 42 and the outer electrode. In one embodiment, the entirety of the upper portion 46U of the conductive strap structure 46' can have a first horizontal cross-sectional shape including a pair of sidewalls laterally spaced by the second width w2, and the entirety of the lower portion 46L of the conductive strap structure 46' can have a second horizontal cross-sectional shape that is the same as the horizontal-cross-sectional shape of the trench embedding the node dielectric 42 and the inner electrode 44.

In one embodiment, the top surface of the semiconductor fin 30 can be coplanar with the top surface of the conductive strap structure 46'. In one embodiment, outer surfaces of the conductive strap structure 46' can include a pair of convex vertical sidewalls CVS that are adjoined to each other by a planar vertical sidewall PVS that is perpendicular to the lengthwise direction of the semiconductor fin 30.

In one embodiment, an insulator layer, i.e., the buried insulator layer 20, can contact the bottom surfaces of the semiconductor fin 30, laterally surround the conductive strap structure 46', and contact outer surfaces of the node dielectric 42. In one embodiment, an interface between the conductive strap structure 46' and the semiconductor fin 30 can be vertically coincident with an interface between the buried insulator layer 20 and the conductive strap structure 46'.

Referring to FIGS. 9A-9D, the fin mask structures 36 and the dielectric spacers 38 can be removed by an etch if not removed in prior steps, which can be an isotropic etch such as a wet etch. For example, if the fin mask structures 36 include silicon nitride, a wet etch employing hot phosphoric acid can be employed to remove the fin mask structures 36. Further, if the dielectric spacers 38 include silicon oxide or organosilicate glass, a wet etch employing hydrofluoric acid can be employed to remove the dielectric spacers 38. Collateral etching of the insulator layer 22 and/or the buried insulator layer 20 may occur depending on the composition of the dielectric spacers 38.

Referring to FIGS. 10A-10D, an insulator layer 22 can be formed over the recessed surfaces of the conductive strap structures 46' by a conformal or non-conformal deposition of a dielectric material and patterned of the deposited dielectric material. The insulator layer 22 includes a dielectric material such as silicon oxide. In one embodiment, the insulator layer 22 can be formed by chemical vapor deposition (CVD) or atomic layer deposition (ALD) of silicon oxide or silicon nitride. The deposited dielectric material can be patterned, for example, by applying and patterning a photoresist layer to cover regions of the exemplary semiconductor structure excluding portions of the semiconductor fins 30 in which access field effect transistors are to be formed, and removing unmasked portions of the deposited dielectric material employing the patterned photoresist layer as an etch mask. The patterned photoresist layer can be subsequently removed, for example, by ashing. Lengthwise sidewalls and top surfaces of the semiconductor fins and top surfaces of the buried insulator layer 20 in proximity to the lengthwise sidewalls of the semiconductor fins 30 become physically exposed.

Figure 11A:
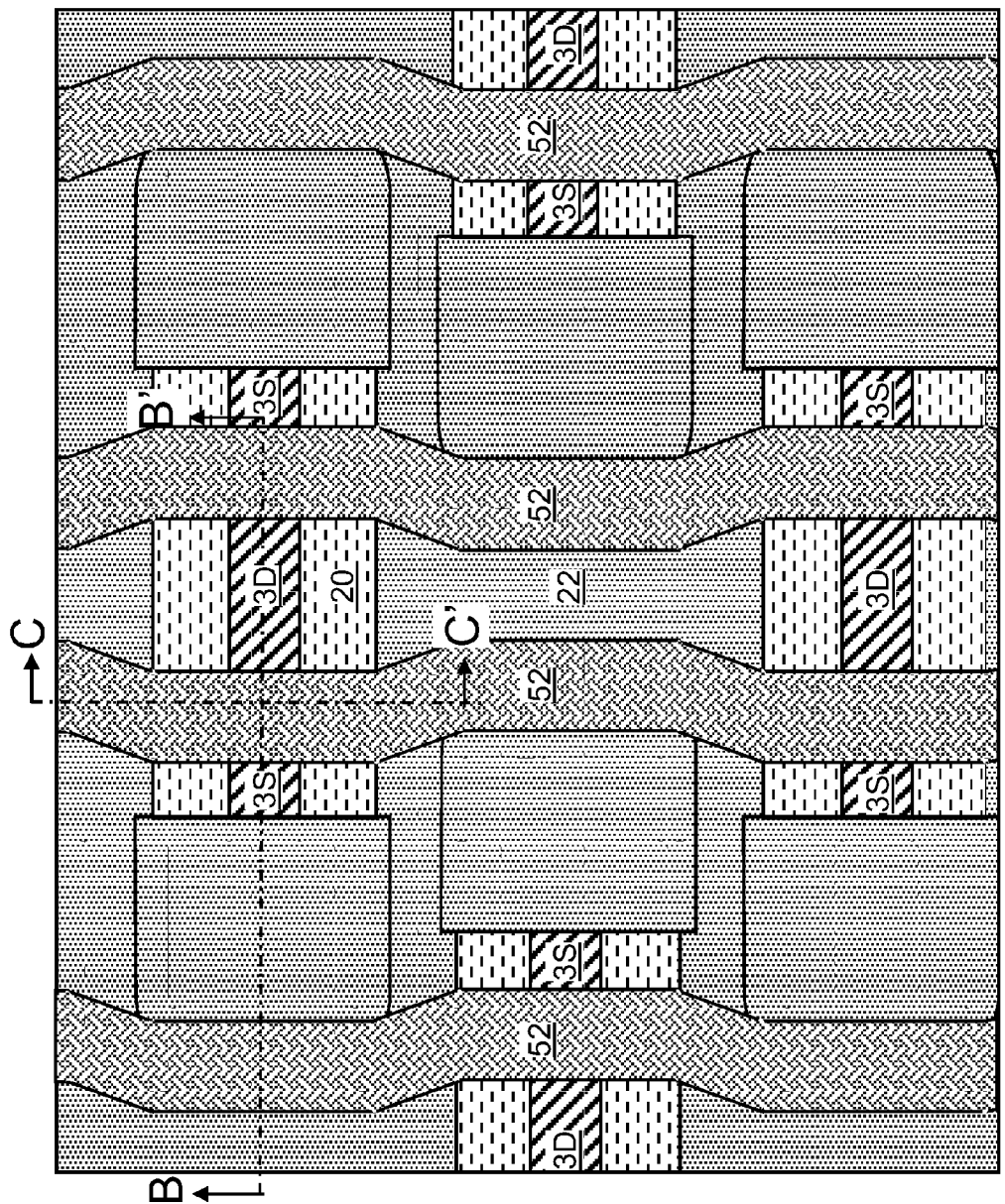
FIG. 11A is a top-down view of the exemplary semiconductor structure after formation of access field effect transistors according to an embodiment of the present disclosure.

Referring to FIGS. 11A-11C, a stack of gate level layers can be deposited and lithographically patterned to form gate structures (50, 52). The gate level layers can include, for example, a gate dielectric layer and a gate conductor layer. The gate dielectric layer can include any gate dielectric material known in the art. The gate conductor layer can include any gate conductor material known in the art. The gate level layers can be patterned by a combination of lithography and etch to form the gate structures (50, 52).

Each remaining portion of the gate dielectric layer within a gate structure (50, 52) constitutes a gate dielectric 50. Each remaining portion of the gate conductor layer within a gate structure (50, 52) constitutes a gate electrode 52. Active portions of the gate structures (50, 52) straddle the portions of the semiconductor fins 30 that become body regions 3B of field effect transistors and extend generally along the widthwise direction, i.e., the horizontal direction that is perpendicular to the lengthwise direction of the semiconductor fins 30. Passive portions of the gate structures (50, 52) can overlie the buried insulator layer 20 and the insulator layer 22 and extend between conductive strap structures 46' and generally along the widthwise direction. As used herein, an "active portion" of a gate structure refers to a portion of the gate structure that functions as a gate electrode and a gate dielectric of an underlying field effect transistor, and a "passive portion" of a gate structure refers to a portion of the gate structure that does not overlie a field effect transistor.

Portions of the semiconductor fins 30 that underlie the gate structures (50, 52) correspond to the body regions of access field effect transistors to be subsequently formed for the trench capacitors (12, 42, 44). The gate structures (50, 52) can extend along the general direction of the widthwise direction of the plurality of semiconductor fins 30. While the present disclosure is described employing gate structures (50, 52) extending along the direction perpendicular to the lengthwise direction of the semiconductor fins 30, embodiments in which wiggles are introduced within the gate structures (50, 52) are expressly contemplated herein.

In one embodiment, the gate structures (50, 52) are permanent gate structures that are present in field effect transistors and function as a combination of a gate dielectric and a gate electrode. In this case, the gate dielectric can include any gate dielectric material that can be employed in gate-first integration schemes, i.e., non-replacement gate integration schemes. Each gate electrode 52 includes a conductive material and is functional, i.e., capable of turning on or off field effect transistors.

Alternately, disposable gate structures may be formed in lieu of the gate structures (50, 52). In this case, the disposable gate structures are temporary structure that is subsequently replaced with replacement gate structures employing methods known in the art.

Source regions 3S and drain regions 3D can be formed by implanting dopants of the opposite conductivity type of the first conductivity type. The gate structures (50, 52) can be employed as mask structures during the ion implantation that forms the source regions 3S and the drain regions 3D. Unimplanted portions of the semiconductor fins 30 constitute body regions 3B.

Gate spacers (not shown) can be formed by depositing a conformal dielectric layer and anisotropically etching the conformal dielectric layer. In one embodiment, the conformal dielectric layer can include a dielectric material different from the dielectric material of the buried insulator layer 20. For example, the conformal dielectric layer can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fins (3S, 3D, 3B) are removed. Each remaining portion of the conformal dielectric layer around a gate structure (50, 52) is a gate spacer. Each gate spacer can laterally surround a gate structure (50, 52).

Optionally, additional electrical dopants can be implanted into the source regions 3S and the drain regions 3D of the semiconductor fins (3S, 3D, 3B) employing the combination of the gate structures (50, 52) and the gate spacers 56 as an implantation mask.

Optionally, a selective epitaxy process can be performed to deposit a semiconductor material on physically exposed semiconductor surfaces. A raised source region (not shown) can be formed directly on each source region 3S, and a raised drain region (not shown) can be formed directly on each drain region 3D. Each raised source region can be epitaxially aligned to an underlying source region 3S. Each raised drain region can be epitaxially aligned to an underlying drain region 3D. The lateral extent of the raised source regions and the raised drain regions is controlled to avoid electrical shorts thereamongst.

Figure 12A:
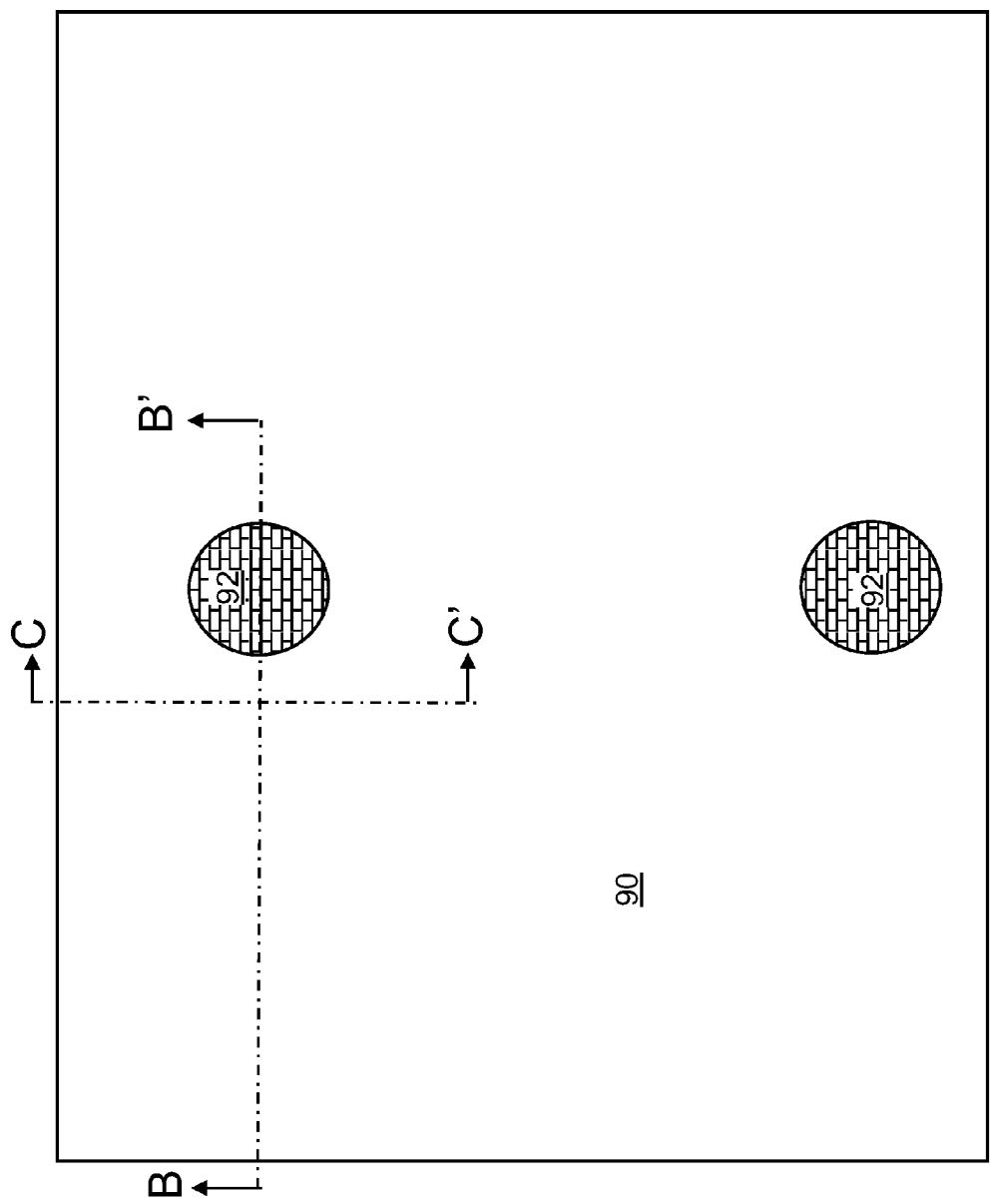
FIG. 12A is a top-down view of the exemplary semiconductor structure after formation of a contact level dielectric layer and contact via structures according to an embodiment of the present disclosure.
Figure 12C:
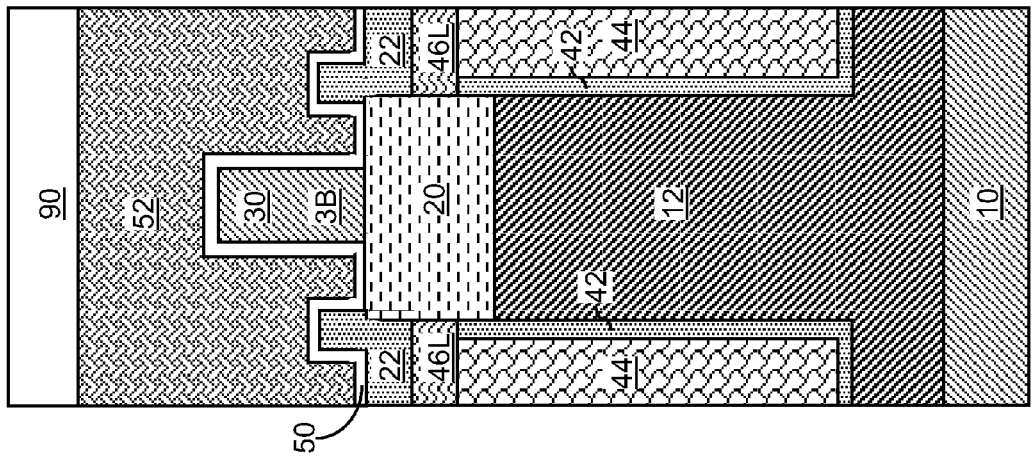
FIG. 12C is a vertical cross-sectional view of the exemplary semiconductor structure along the vertical plane C-C' of FIG. 12A.
Figure 12B:
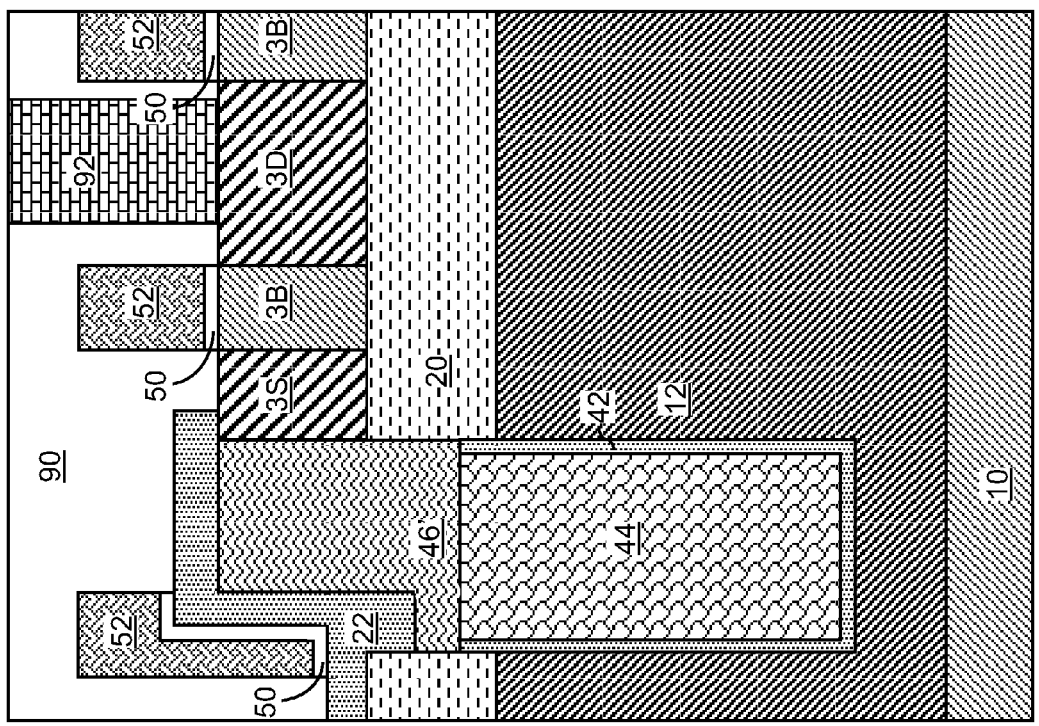
FIG. 12B is a vertical cross-sectional view of the exemplary semiconductor structure along the vertical plane B-B' of FIG. 12A.

Referring to FIGS. 12A-12C, a contact level dielectric layer 90 is formed over the plurality of semiconductor fins (3S, 3D, 3B) and the gate structures (50, 52). The contact level dielectric layer 90 can be formed, for example, by spin-on coating or chemical vapor deposition (CVD) of a dielectric material. The contact level dielectric layer 90 may include a single dielectric material layer, or may include a plurality of dielectric material layers. The top surface of the contact level dielectric layer 90 can be planarized, for example, by chemical mechanical planarization. Contact via structures such as drain contact via structures 92 and gate contact via structures (not shown) can be formed through the contact level dielectric layer 90 employing methods known in the art.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a semiconductor fin located on a substrate and including a region having a first width and an end portion having a second width that is greater than said first width;
    a trench capacitor located within said substrate and including an inner electrode, a node dielectric, and an outer electrode; and
    a conductive strap structure, wherein a lower portion of said conductive strap structure vertically contacts said inner electrode and an upper portion of said conductive strap structure laterally contacts said semiconductor fin and includes a portion having said second width,
    wherein a top surface of said semiconductor fin is coplanar with a top surface of said conductive strap structure.

2. The semiconductor structure of claim 1, wherein a sidewall of said semiconductor fin and a sidewall of said conductive strap structure are within a same vertical plane.

3. The semiconductor structure of claim 1, wherein a concave vertical sidewall of said semiconductor fin contacts a convex vertical sidewall of said conductive strap structure at an interface between said semiconductor fin and said conductive strap structure.

4. The semiconductor structure of claim 3, wherein said convex vertical sidewall of said conductive strap structure is vertically coincident with an interface between said node dielectric and said outer electrode.

5. The semiconductor structure of claim 1, wherein an entirety of sidewall surfaces of said conductive strap structure is vertically coincident with an interface between said node dielectric and said outer electrode.

6. The semiconductor structure of claim 1, wherein an entirety of said upper portion of said conductive strap structure has a first horizontal cross-sectional shape including a pair of sidewalls laterally spaced by said second width, an entirety of said lower portion of said conductive strap structure has a second horizontal cross-sectional shape that is the same as a horizontal-cross-sectional shape of a trench embedding said node dielectric and said inner electrode.

7. The semiconductor structure of claim 1, wherein outer surfaces of said conductive strap structure comprise a pair of convex vertical sidewalls that are adjoined to each other by a planar vertical sidewall that is perpendicular to a lengthwise direction of said semiconductor fin.

8. The semiconductor structure of claim 1, further comprising an insulator layer contacting a bottom surface of said semiconductor fin and laterally surrounding said conductive strap structure and contacting outer surfaces of said node dielectric.

9. The semiconductor structure of claim 8, wherein an interface between said conductive strap structure and said semiconductor fin is vertically coincident with an interface between said insulator layer and said conductive strap structure.

10. A semiconductor structure comprising:
    a semiconductor fin located on a substrate and including a region having a first width and an end portion having a second width that is greater than said first width;
    a trench capacitor located within said substrate and including an inner electrode, a node dielectric, and an outer electrode; and
    a conductive strap structure, wherein a lower portion of said conductive strap structure vertically contacts said inner electrode and an upper portion of said conductive strap structure laterally contacts said semiconductor fin and includes a portion having said second width,
    wherein an entirety of sidewall surfaces of said conductive strap structure is vertically coincident with an interface between said node dielectric and said outer electrode.

11. The semiconductor structure of claim 10, wherein a sidewall of said semiconductor fin and a sidewall of said conductive strap structure are within a same vertical plane.

12. The semiconductor structure of claim 10, wherein a concave vertical sidewall of said semiconductor fin contacts a convex vertical sidewall of said conductive strap structure at an interface between said semiconductor fin and said conductive strap structure.

13. The semiconductor structure of claim 12, wherein said convex vertical sidewall of said conductive strap structure is vertically coincident with an interface between said node dielectric and said outer electrode.

14. The semiconductor structure of claim 10, wherein an entirety of said upper portion of said conductive strap structure has a first horizontal cross-sectional shape including a pair of sidewalls laterally spaced by said second width, an entirety of said lower portion of said conductive strap structure has a second horizontal cross-sectional shape that is the same as a horizontal-cross-sectional shape of a trench embedding said node dielectric and said inner electrode.

15. The semiconductor structure of claim 10, wherein a top surface of said semiconductor fin is coplanar with a top surface of said conductive strap structure.

16. The semiconductor structure of claim 10, wherein outer surfaces of said conductive strap structure comprise a pair of convex vertical sidewalls that are adjoined to each other by a planar vertical sidewall that is perpendicular to a lengthwise direction of said semiconductor fin.

17. The semiconductor structure of claim 10, further comprising an insulator layer contacting a bottom surface of said semiconductor fin and laterally surrounding said conductive strap structure and contacting outer surfaces of said node dielectric.

18. The semiconductor structure of claim 17, wherein an interface between said conductive strap structure and said semiconductor fin is vertically coincident with an interface between said insulator layer and said conductive strap structure.

19. A semiconductor structure comprising:
    a semiconductor fin located on a substrate and including a region having a first width and an end portion having a second width that is greater than said first width;
    a trench capacitor located within said substrate and including an inner electrode, a node dielectric, and an outer electrode; and
    a conductive strap structure, wherein a lower portion of said conductive strap structure vertically contacts said inner electrode and an upper portion of said conductive strap structure laterally contacts said semiconductor fin and includes a portion having said second width, wherein an entirety of said upper portion of said conductive strap structure has a first horizontal cross-sectional shape including a pair of sidewalls laterally spaced by said second width, an entirety of said lower portion of said conductive strap structure has a second horizontal cross-sectional shape that is the same as a horizontal-cross-sectional shape of a trench embedding said node dielectric and said inner electrode.

\* \* \* \* \*